United States Patent
Miura et al.

(10) Patent No.: US 9,376,751 B2
(45) Date of Patent: Jun. 28, 2016

(54) PLASMA PROCESSING DEVICE AND OPERATION METHOD

(71) Applicant: Tokyo Electron Limited, Tokyo (JP)

(72) Inventors: Shigehiro Miura, Iwate (JP); Hitoshi Kato, Iwate (JP); Jun Sato, Iwate (JP); Takeshi Kobayashi, Iwate (JP); Masato Yonezawa, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/614,926

(22) Filed: Feb. 5, 2015

(65) Prior Publication Data
US 2015/0235813 A1    Aug. 20, 2015

(30) Foreign Application Priority Data
Feb. 19, 2014    (JP) .................................. 2014-029179

(51) Int. Cl.
| | |
|---|---|
| *H01J 37/32* | (2006.01) |
| *H01L 21/302* | (2006.01) |
| *C23C 16/455* | (2006.01) |
| *C23C 16/52* | (2006.01) |
| *C23C 16/458* | (2006.01) |

(52) U.S. Cl.
CPC ....... *C23C 16/45525* (2013.01); *C23C 16/4584* (2013.01); *C23C 16/45536* (2013.01); *C23C 16/45551* (2013.01); *C23C 16/45578* (2013.01); *C23C 16/52* (2013.01); *H01J 37/32091* (2013.01); *H01J 37/32165* (2013.01)

(58) Field of Classification Search
None
See application file for complete search history.

(56) References Cited

U.S. PATENT DOCUMENTS

| | | | |
|---|---|---|---|
| 2008/0142986 A1* | 6/2008 | Yasumori | ............ H01L 23/5223 257/773 |
| 2009/0108759 A1* | 4/2009 | Tao | .......................... H05H 1/46 315/111.21 |

FOREIGN PATENT DOCUMENTS

JP    2012-253313    12/2012

* cited by examiner

*Primary Examiner* — Shamim Ahmed
(74) *Attorney, Agent, or Firm* — IPUSA, PLLC

(57) ABSTRACT

An operation method of a plasma processing device, includes performing a plasma process on a workpiece by supplying first high frequency power of a predetermined output to an electrode and generating plasma; and performing a charge storage process before the plasma process when a time interval from an end of a previous operation of the plasma processing device exceeds a predetermined interval, the charge storage process including supplying, to the electrode, second high frequency power of a lower output than the predetermined output.

12 Claims, 20 Drawing Sheets

ROTATIONAL DIRECTION
OF
TURNTABLE

FIG.13

| Parameter | setting |
|---|---|
| Temp. [deg.C] | 600 |
| Pressure [Torr] | 1.8 |
| Rotation speed [rpm] | 10 |
| Area-$N_2$ [sccm] | 1000 |
| TOP Block $N_2$ [sccm] | 2000 |
| Plasma line Ar [sccm] | 15000 |
| Plasma line $NH_3$ [sccm] | 100 |
| Si line $N_2$ [sccm] | 1000 |
| $O_3$ line $N_2$ [sccm] | 500 |
| Heater $N_2$ [sccm] | 0 |
| Lifter $N_2$ [sccm] | 0 |
| RF PWR [W] | Variable |

| Kind of Cooling water for RF antenna | |
|---|---|
| Water | A |
| Electrical Inductivity [mS/m] | 1.5 (same as NRD) |

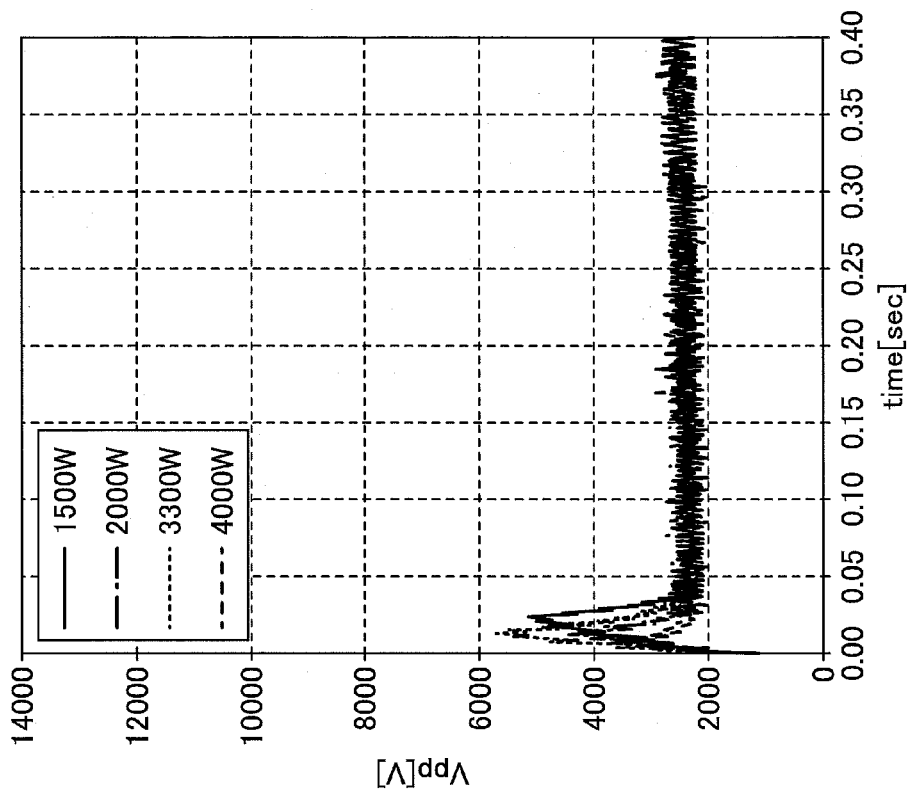
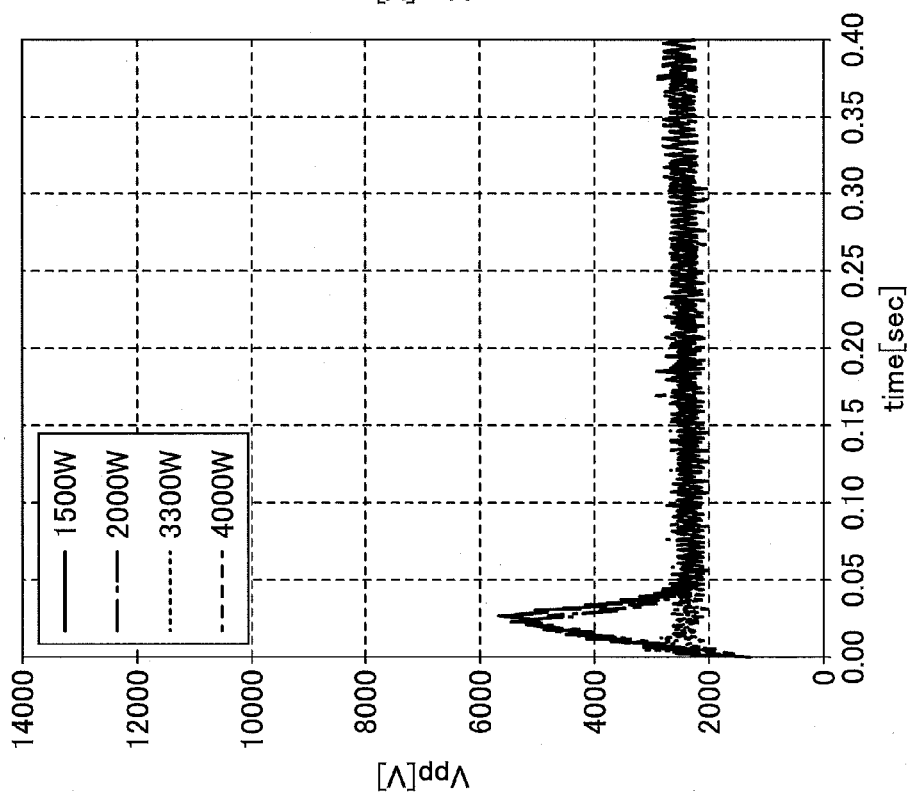

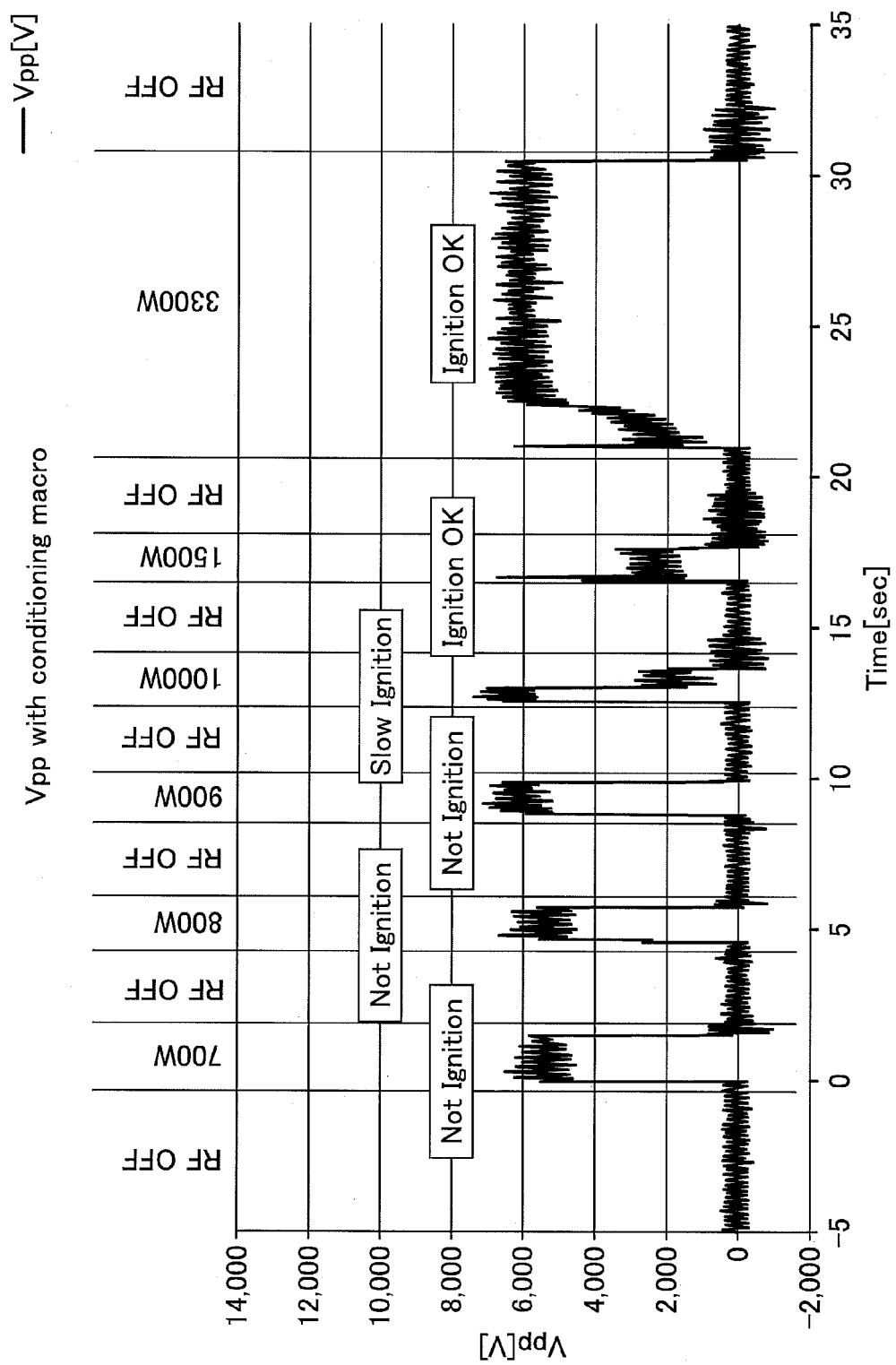

PLASMA PROCESSING DEVICE AND OPERATION METHOD

CROSS-REFERENCE TO RELATED APPLICATION

The present application is based upon and claims the benefit of priority of Japanese Patent Application No. 2014-029179, filed on Feb. 19, 2014, the entire contents of which are incorporated herein by reference.

BACKGROUND OF THE INVENTION

1. Field of the Invention

An aspect of this disclosure relates to a plasma processing device and an operation method thereof.

2. Description of the Related Art

Conventionally, there is known a film deposition device and a film deposition method using the following method of generating plasma inside a chamber, in a film deposition process that is demanded to be high quality and metal contamination-free. The method includes providing a coil type electrode outside the chamber, introducing the electric field and the magnetic field, which are generated from the electrode to which a high frequency wave is applied, into the chamber through a highly-pure dielectric window made of quartz and alumina, and generating plasma discharge inside the chamber. As described in Japanese Laid-Open Patent Publication No. 2012-253313, there is known a film deposition device and a film deposition method using the above plasma process, by which the plasma process can be performed at high temperature in order to obtain a film of even higher quality.

However, in a film deposition device using plasma as described above, when the plasma discharge is stopped by stopping the operation of the chamber for several hours to several days after the plasma process, there has been a phenomenon where the plasma discharge cannot be easily caused, particularly when the operation is resumed for maintenance purposes or when the device is initially activated.

Furthermore, the above phenomenon may not only occur in a film deposition device, but also in all kinds of plasma processing devices that perform a plasma process such as an etching device.

SUMMARY OF THE INVENTION

In view of the above, an aspect of the present invention relates to a plasma processing device and an operation method thereof, in which even when the plasma processing device stops operating for a long time, plasma discharge can be stably caused, and a high quality plasma process can be maintained.

In an aspect of this disclosure, there is provided an operation method of a plasma processing device, including performing a plasma process on a workpiece by supplying first high frequency power of a predetermined output to an electrode and generating plasma; and performing a charge storage process before the plasma process when a time interval from an end of a previous operation of the plasma processing device exceeds a predetermined interval, the charge storage process including supplying, to the electrode, second high frequency power of a lower output than the predetermined output.

In an aspect of this disclosure, there is provided a plasma processing device including a processing chamber configured to perform a plasma process on a workpiece; a plasma gas supply unit configured to supply plasma gas inside the processing chamber; an electrode configured to generate at least one of an electric field and a magnetic field to be introduced inside the processing chamber to generate plasma from the plasma gas; a high frequency power source configured to supply high frequency power to the electrode in a variable manner; a time measuring unit configured to measure an elapsed time from an end of a previous plasma process in the processing chamber; an operation switch configured to be operated to start the plasma process; and a control unit configured to implement control when the operation switch is operated and the plasma process is started, such that the plasma process is immediately performed when the elapsed time measured by the time measuring unit is shorter than a predetermined time interval, the plasma process being performed by setting the high frequency power of the high frequency power source to a predetermined high frequency power for processing, and the plasma process is performed after implementing charge storage control when the elapsed time measured by the time measuring unit is longer than the predetermined time interval, the charge storage control including supplying, to the electrode, high frequency power for charge storage, which is the high frequency power of the high frequency power source that is lower than the predetermined high frequency power for processing.

BRIEF DESCRIPTION OF THE DRAWINGS

FIG. 13 is a table indicating the conditions used in an experiment;

FIGS. 14A and 14B illustrate the comparison of plasma discharge when the inside of the processing chamber 1 is 400° C. and 600° C.;

FIG. 20 illustrates the results of a third example, in which the elapsed time from the end of the previous plasma processing is 16 hours.

DESCRIPTION OF THE PREFERRED EMBODIMENTS

Embodiments of the present invention are described below with reference to the accompanying drawings.

First, a description is given of an example of a film deposition device to which a plasma processing device and a method of operating the plasma processing device according to a first embodiment of the present invention, are applied. The plasma processing device and the operation method thereof according to an embodiment of the present invention are applicable not only to a film deposition device, but also to all kinds of devices that perform a plasma process such as an etching device; however, in the present embodiment, a description is given of an example in which a plasma processing device according to an embodiment of the present invention is constituted as a film deposition device.

Figure 1:
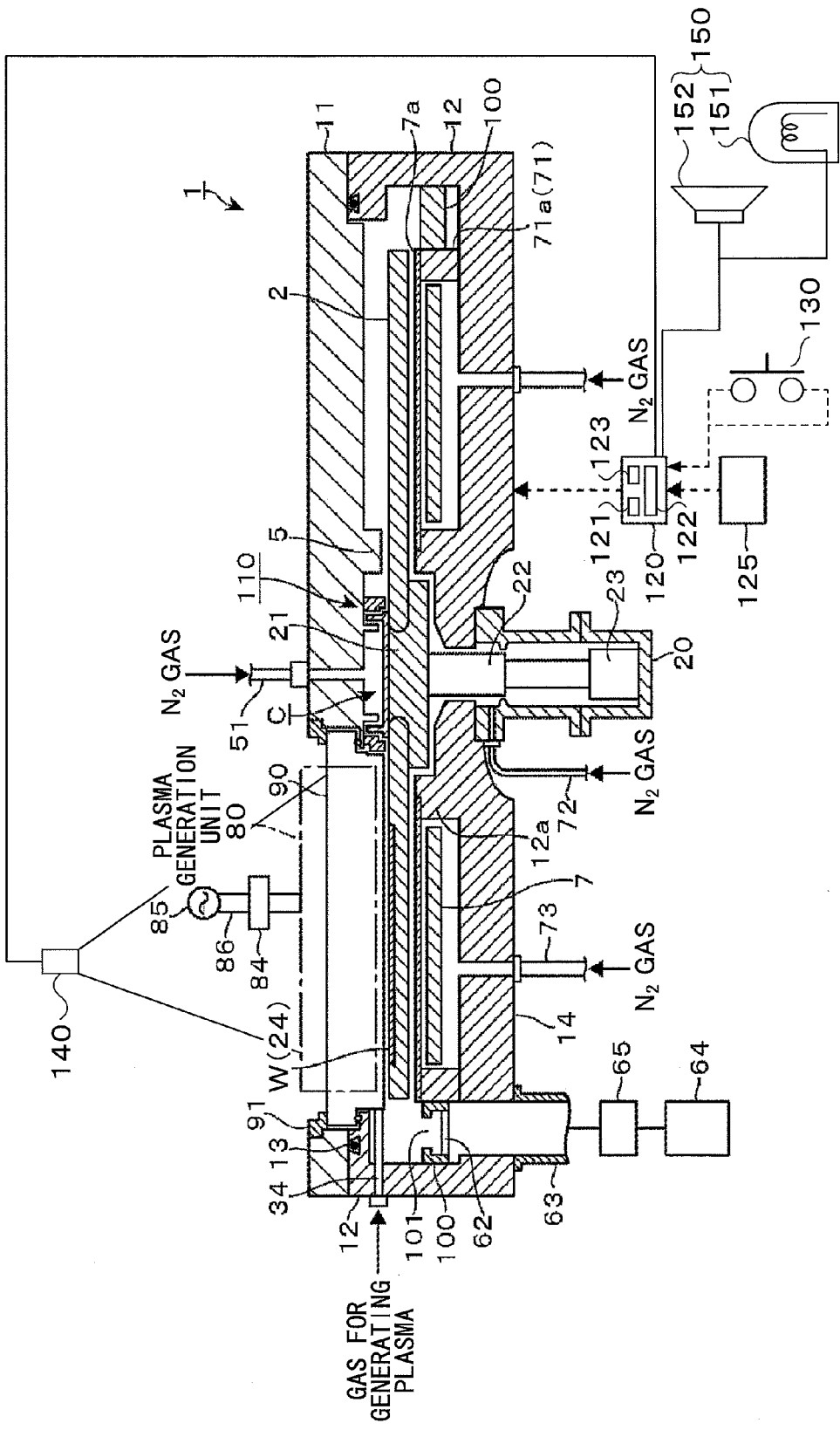
FIG. 1 is a vertical cross-sectional view of an example of a film deposition device to which a plasma processing device according to a first embodiment of the present invention is applied.
Figure 2:
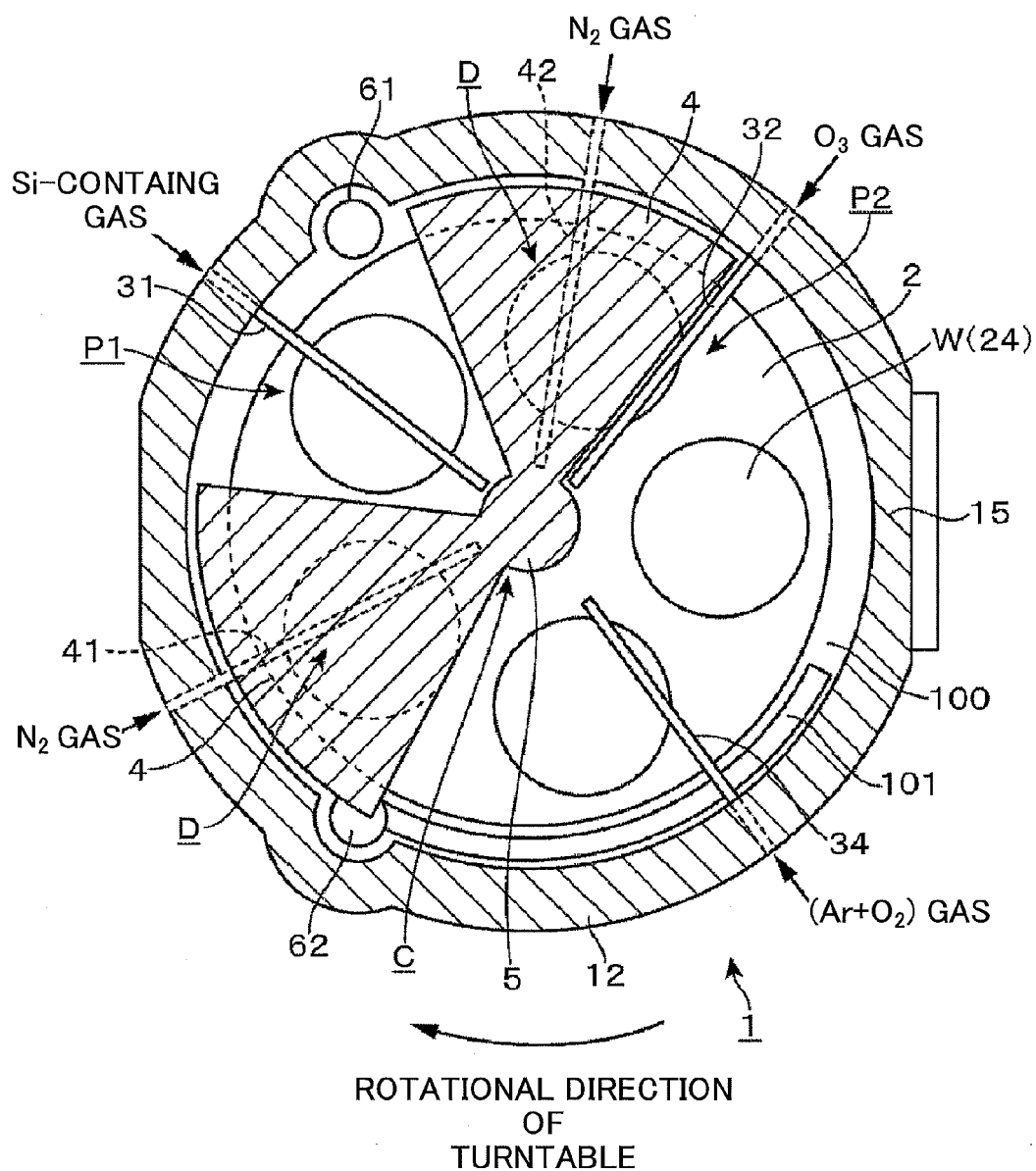
FIG. 2 is a horizontal cross-sectional view of an example of the film deposition device to which the plasma processing device according to the first embodiment of the present invention is applied.

A description is given of an example of a film deposition device to which a plasma processing device according to an embodiment of the present invention is applied, with reference to FIGS. 1 through 11. As illustrated in FIGS. 1 and 2, this film deposition device includes a processing chamber 1 having a substantially circular planar shape, and a turntable 2 provided inside the processing chamber 1, which has a rotational center positioned at the center of the processing chamber 1. Furthermore, as described in detail below, this film deposition device is constituted to deposit a thin film by depositing reaction products in a layer-by-layer manner, on the surface of a wafer W by an ALD method, and implementing plasma modification on this thin film. At this time, to implement plasma modification, the film deposition device is constituted such that electrical damages caused by plasma are not applied to the wafer W that is the workpiece, or such damages are minimized. Next, detailed descriptions are given of the respective elements of the film deposition device.

The processing chamber 1 includes a ceiling 11 and a chamber body 12, and the ceiling 11 is detachable from the chamber body 12. At the center part on the top surface side of the ceiling 11, a separation gas supply tube 51 is connected for supplying $N_2$ (nitrogen) gas as separation gas, for preventing different types of processing gas from mixing with each other, at a center part area C in the processing chamber 1. Furthermore, FIG. 1 illustrates a seal member 13 (for example, an O-ring) provided in a ring shape along the outer peripheral part of the top surface of the chamber body 12.

The center part of the turntable 2 is fixed to a core part 21 having a substantially cylindrical shape. The turntable 2 is rotatable around a vertical axis (in a clockwise direction in this example), by a rotary shaft 22, which is connected to the bottom surface of the core part 21 and which extends in the vertical direction. FIG. 1 illustrates a driving unit 23 that rotates the rotary shaft 22 around the vertical axis, and a case body 20 for accommodating the rotary shaft 22 and the driving unit 23. The flange part of the top surface of this case body 20 is attached to the bottom side of a bottom surface part 14 of the processing chamber 1 in a gastight manner. Furthermore, to the case body 20, a purge gas supply tube 72 is connected to the area below the turntable 2, for supplying the $N_2$ gas as purge gas. In the processing chamber 1, at the part of the bottom surface part 14 at the outer peripheral side of the core part 21, a ring shape is formed adjacent to the turntable 2 from below the turntable 2, and the ring shape constitutes a protruding part 12a.

Figure 3:
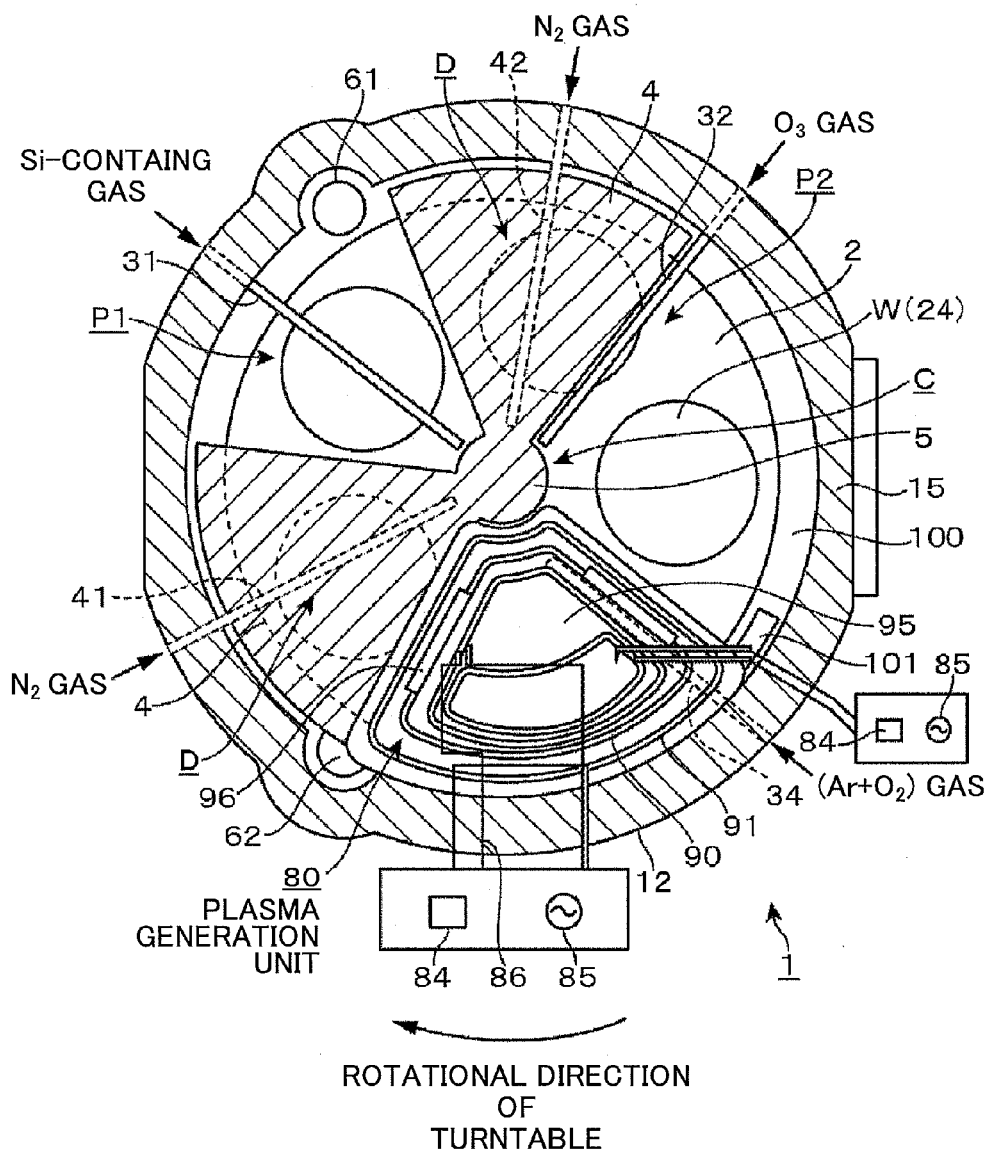
FIG. 3 is a horizontal cross-sectional view of an example of the film deposition device to which the plasma processing device according to the first embodiment of the present invention is applied.

As illustrated in FIGS. 2 and 3, on the surface of the turntable 2, circular recessed portions 24 are provided as substrate mounting areas for mounting wafers W which are a plurality of (for example, five) substrates, along the rotational direction (circumferential direction). The diameter and the depth of the recessed portions 24 are set such that when wafers W having a diameter of, for example, 300 mm, are dropped (accommodated) in the recessed portions 24, the surface of the wafer W and the surface of the turntable 2 (areas where the wafers W are not mounted) are aligned. At the bottom of the recessed portions 24, through holes (not illustrated) are formed for piercing three lift pins described below, for raising the wafer W from below and lifting the wafer W.

As illustrated in FIGS. 2 and 3, five nozzles 31, 32, 34, 41, and 42 made of, for example, quartz, are radially arranged at positions of the turntable 2 facing the recessed portions 24. The nozzles 31, 32, 34, 41, and 42 are arranged interposing gaps in the peripheral direction (a rotational direction of the turntable 2) of the processing chamber 1. For example, these nozzles 31, 32, 34, 41, and 42 are attached so as to extend horizontally facing the wafer W from the outer peripheral wall of the processing chamber 1 toward the center part area C. In this example, a plasma gas supply nozzle 34, a separation gas nozzle 41, a first processing gas nozzle 31, a separation gas nozzle 42, and a second processing gas nozzle 32 are arranged in the stated order in a clockwise direction (rotation direction of turntable 2) as viewed from a transfer opening 15 described below. As illustrated in FIG. 1, above the plasma gas supply nozzle 34, a plasma generation unit 80 is provided for turning the gas discharged from the plasma gas supply nozzle 34 into plasma. The plasma generation unit 80 is described in detail below.

The processing gas nozzles 31, 32 constitute a first processing gas supply unit and a second processing gas supply unit, respectively. The separation gas nozzles 41, 42 constitute separation gas supply units, respectively. Note that FIG. 2 illustrates a state that the plasma generation unit 80 and the case 90 have been removed such that the plasma gas supply nozzle 34 can be seen, and FIG. 3 illustrates a state where the plasma generation unit 80 and the case 90 are attached. Furthermore, in FIG. 1, the plasma generation unit 80 is schematically illustrated by a dashed-dotted line.

The nozzles 31, 32, 34, 41, and 42 are respectively connected to gas supply sources (not illustrated) described below, via flow rate adjustment valves. That is to say, the first processing gas nozzle 31 is connected to a supply source of first processing gas including Si (silicon), for example, BTBAS (bis (tertiary-butylamino) silane) gas and $SiH_2(NH-C(CH_3)_3)_2$ gas. The second processing gas nozzle 32 is connected to a supply source of second processing gas, which is mixed gas of, for example, an $O_3$ (ozone) gas and an $O_2$ (oxygen) gas. The plasma gas supply nozzle 34 is connected to a supply source of mixed gas of, for example, Ar (argon) gas and $O_2$ gas (having a volume ratio of approximately ($Ar:O_2$=100:0.5 through 100:20). The separation gas nozzles 41, 42 are respectively connected to gas supply sources of $N_2$ (nitrogen) gas which is separation gas. Furthermore, in the following, as a matter of convenience, the second processing gas is described as an $O_3$ gas. Note that the second processing gas nozzle 32 is provided with a ozonizer (not illustrated) for generating $O_3$ gas.

On the bottom surface side of the nozzles 31, 32, 34, 41, and 42, for example, gas transfer openings 33 are equidistantly formed at a plurality of positions along the radial direction of the turntable 2. On the side surface of the plasma gas supply nozzle 34, the gas transfer openings 33 having a diameter of, for example, 0.3 mm through 0.5 mm, are equidistantly formed at a plurality of positions along the longitudinal direction of the plasma gas supply nozzle 34, so as to face the upstream side in the rotation direction (on the side of the second processing gas nozzle 32) and the bottom side (obliquely downward) of the turntable 2. The reason of setting the direction of the gas transfer openings 33 of the plasma gas supply nozzle 34 as described above, is described below. These nozzles 31, 32, 34, 41, and 42 are arranged such that the distance between the bottom edge of the nozzles 31, 32, 34, 41, and 42 and the top surface of the turntable 2 is, for example, approximately 1 mm through 5 mm.

The areas below the first processing gas nozzles 31, 32, are a first processing area P1 where the Si containing gas is absorbed by the wafer W, and a second processing area P2 where the Si containing gas absorbed in the wafer W reacts with the $O_3$ gas, respectively. The separation gas nozzles 41, 42 are for forming separation areas D that separate the first processing area P1 and the second processing area P2. As illustrated in FIGS. 2 and 3, sector-like portions 4 having a substantially sector shape, are provided on the ceiling 11 of the processing chamber 1 in the separation areas D, and the separation gas nozzles 41, 42 are accommodated in grooves 43 that are formed in the sector-like portions 4. Therefore, on both sides of each of the gas nozzles 41, 42 in the circumferential direction of the turntable 2, there is provided a low ceiling face 44 (first ceiling face) that corresponds to the bottom surface of the sector-like portion 4, in order to prevent the different types of processing gas from being mixed. On either side of the ceiling face 44 in the circumferential direction, there is provided a ceiling face 45 (second ceiling face) that is lower than the ceiling face 44. The outer peripheral parts (the outer edge side of the processing chamber 1) of the sector-like portions 4 form bent portions which are bent into an L shape so as to face the outer edge surface of the turntable 2 and to be slightly spaced apart from the chamber body 12, in order to prevent the different types of processing gas from being mixed.

Figure 4:
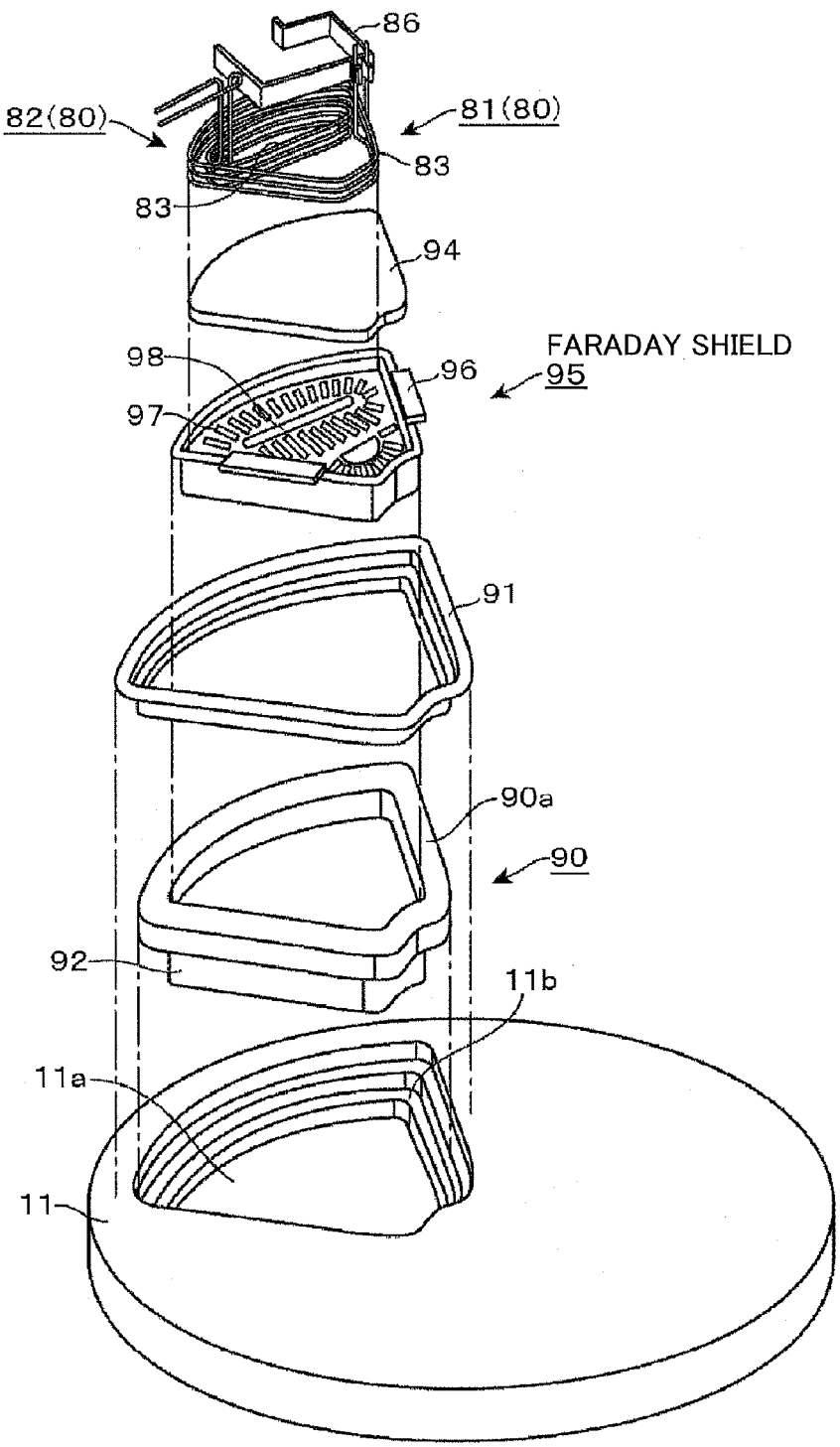
FIG. 4 is an exploded perspective view of part of the inside of the film deposition device to which the plasma processing device according to the first embodiment of the present invention is applied.

Next, a detailed description is given of the plasma generation unit 80. The plasma generation unit 80 is constituted by winding around an electrode 83 (or may be referred to as an "antenna") to form a coil, which is constituted by a metal line such as copper (Cu). The plasma generation unit 80 is provided on the ceiling 11 of the processing chamber 1 so as to be partitioned from the inside area of the processing chamber 1 in a gastight manner. In this example, the electrode 83 is made of a material formed by applying a nickel coating and gold coating on a copper surface in the stated order. Specifically, as illustrated in FIG. 4, an opening 11a that is open in a substantially sector shape in a planar view is formed in the ceiling 11 above the plasma gas supply nozzle 34 (specifically, from a position that is slightly on the upstream side in the rotational direction of the turntable 2 with respect to the plasma gas supply nozzle 34, to a position that is slightly closer to the plasma gas supply nozzle 34 than the separation area D on the downstream side in the rotational direction of the plasma gas supply nozzle 34).

Figure 5:
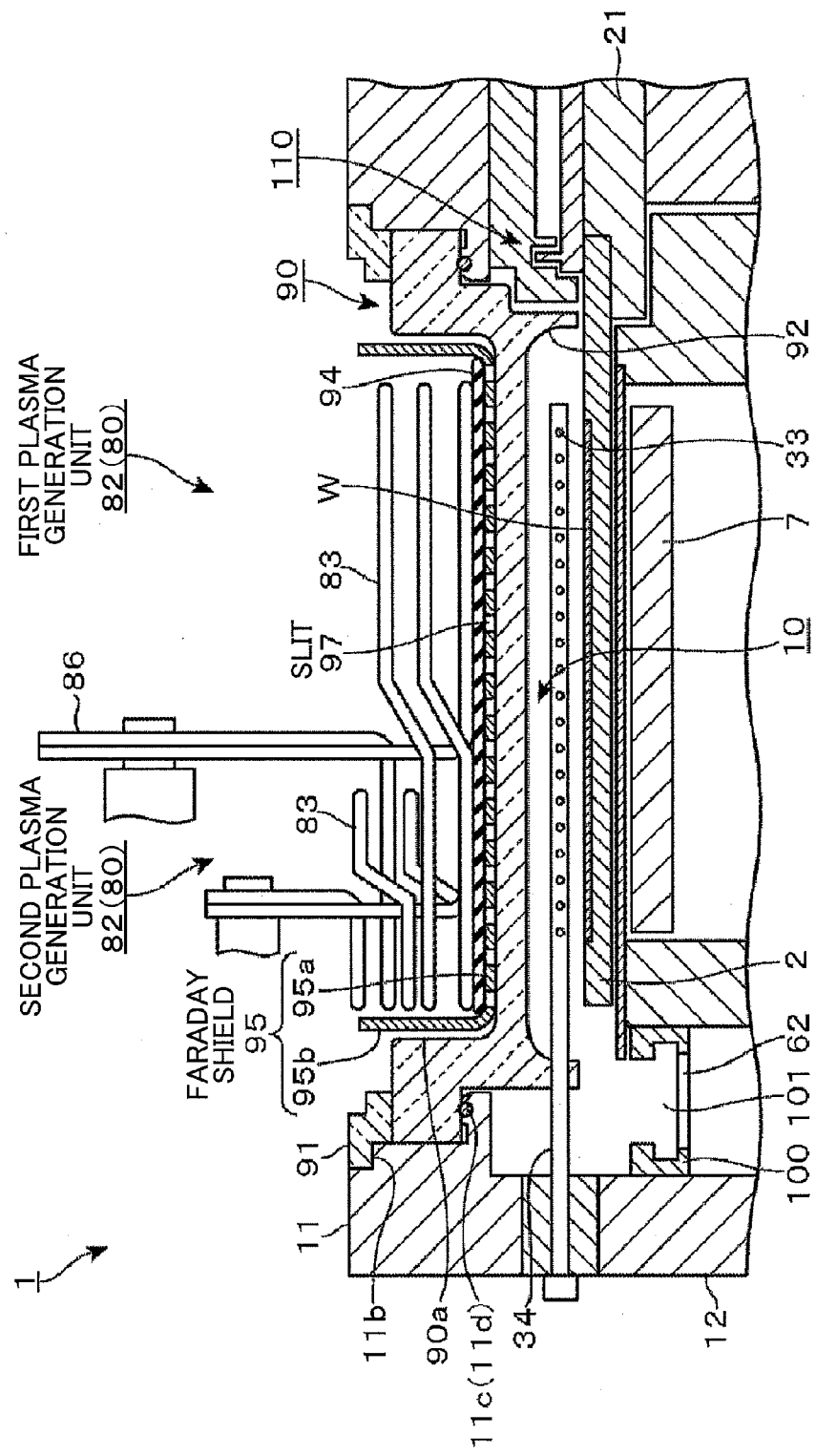
FIG. 5 is a vertical cross-sectional view of part of the inside of the film deposition device to which the plasma processing device according to the first embodiment of the present invention is applied.

The opening 11a is formed from a position that is spaced apart from the rotational center of the turntable 2 toward the outer peripheral side by, for example, approximately 60 mm, to a position that is spaced apart from the outer edge of the turntable 2 toward the outside by, for example, approximately 80 mm. Furthermore, the edge of the opening 11a on the center side of the turntable 2 in a planar view is concaved in an arc shape along the outer edge of a labyrinth structure part 110, so as not to interfere with (to avoid) the labyrinth structure part 110 (described below) provided at the center part area C of the processing chamber 1. Furthermore, as illustrated in FIGS. 4 and 5, in the opening 11a, three stage parts 11b are formed in the circumferential direction, such that the diameter of the opening 11a is gradually reduced from the top side of the ceiling 11 toward the bottom side of the ceiling 11. On the top surface of the lowest one of the stage parts 11b (rim part), there is formed a groove 11c in the circumferential direction as illustrated in FIG. 5. A seal member, for example, an O-ring 11d is arranged in the groove 11c. Note that the groove 11c and the O-ring 11d are not illustrated in FIG. 4.

Figure 6:
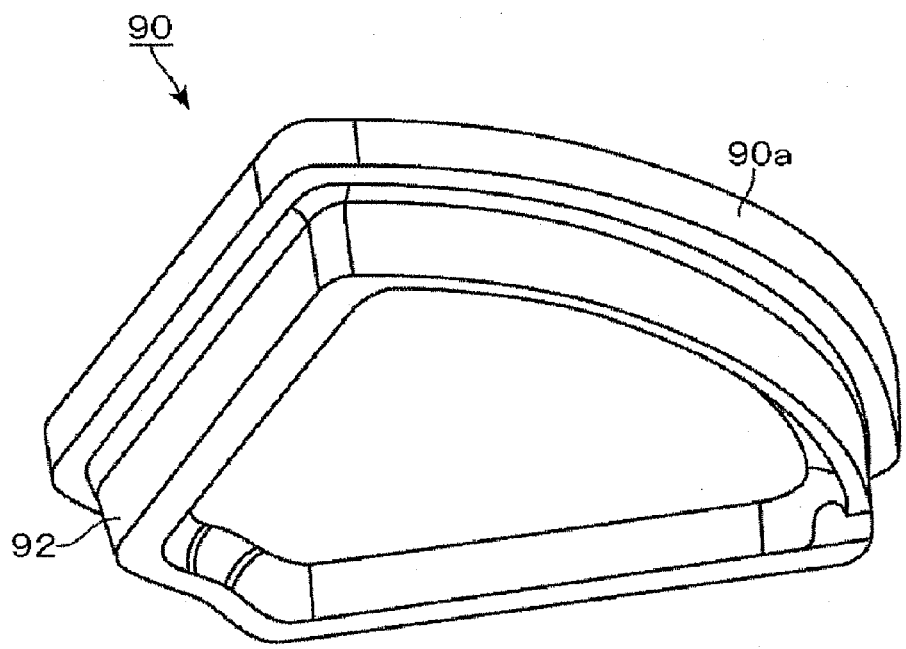
FIG. 6 is a perspective view of part of the inside of the film deposition device to which the plasma processing device according to the first embodiment of the present invention is applied.
Figure 9:
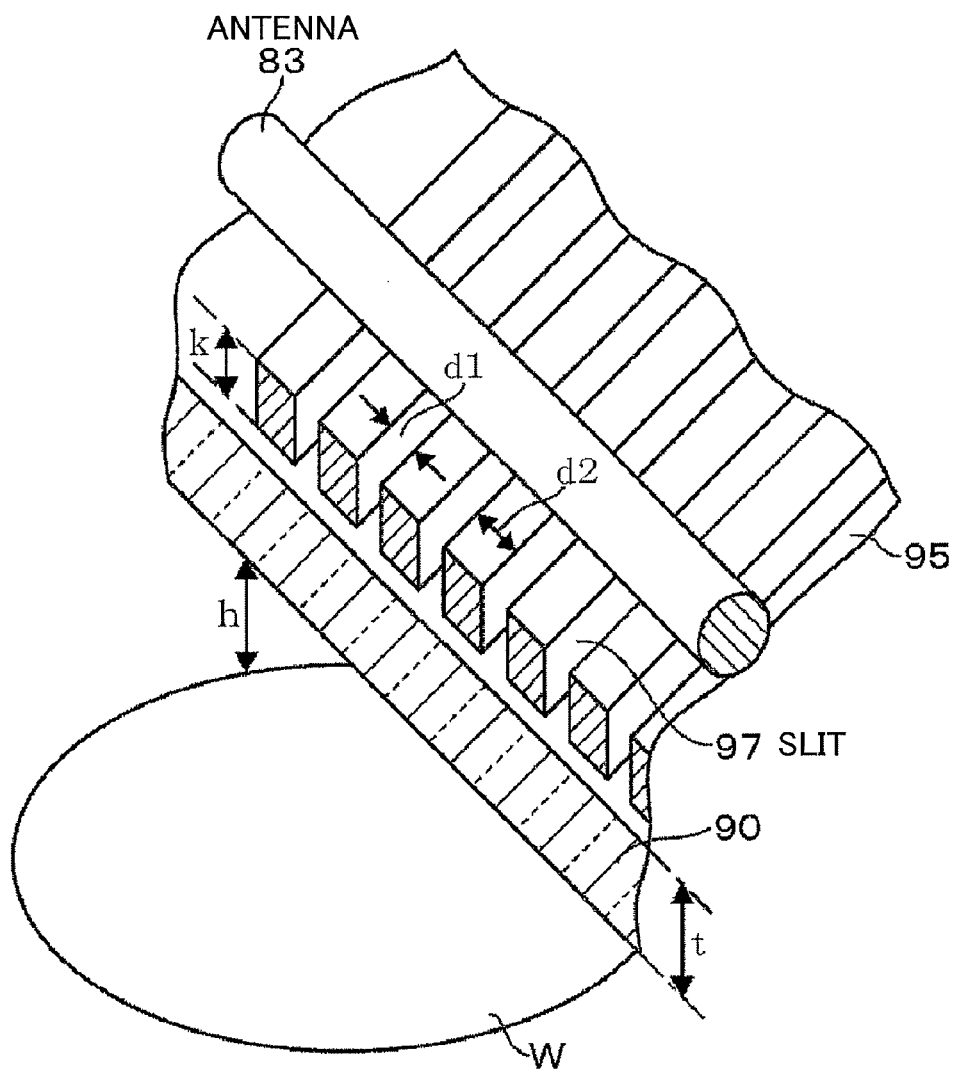
FIG. 9 is a perspective view of part of a Faraday shield of the film deposition device to which the plasma processing device according to the first embodiment of the present invention is applied.

In the opening 11a, as illustrated in FIG. 6, the case 90 is arranged. In the case 90, the outer peripheral part on the top side extends out horizontally along the circumferential direction in a flange shape forming a flange part 90a. Furthermore, the center part of the case 90 is formed so as to be concaved toward the inside area of the processing chamber 1 below the case 90. This case 90 is a magnetically permeable body (a material through which magnetic force is permeated), constituted by a dielectric body such as quarts, in which the thickness t of the concaved part is, for example, 20 mm as illustrated in FIG. 9. Furthermore, when the wafer W is positioned at the bottom of the case 90, on the side of the center part area C, the distance between the inner wall surface of the case 90 and the outer edge of the wafer W is 70 mm, and on outer peripheral side of the turntable 2, the distance between the inner wall surface of the case 90 and the outer edge of the wafer W is 70 mm. Thus, the angle α formed by the two sides of the opening 11a at the upstream side and the downstream side in the rotational direction of the turntable 2 and the rotational center of the turntable 2 is, for example, 68°.

Note that the case 90 is constituted by a material having a high anti-plasma etching property such as high purity quartz, high purity alumina, and yttria, or at least the surface layer part of the case 90 is coated by this material. Thus, the case 90 is basically constituted by a dielectric body.

When the case 90 is dropped in the opening 11a, the flange part 90a is latched at the bottommost stage part 11b. Then, the stage parts 11b (ceiling 11) and the case 90 are connected in a gastight manner by the O-ring 11d. Furthermore, the flange part 90a is pressed downward along the circumferential direction by a suppressing member 91, which is formed to have a frame-like shape extending along the outer edge of the opening 11a, and the suppressing member 91 is fixed to the ceiling 11 by a bolt (not illustrated), and therefore the internal atmosphere of the processing chamber 1 is set to be gastight. When the case 90 is fixed to the ceiling 11 in a gastight manner as described above, the space h between the bottom surface of the case 90 and the surface of the wafer W on the turntable 2 is 4 mm through 60 mm (30 mm in this example). Note that FIG. 6 is a view from the bottom of the case 90.

As illustrated in FIGS. 1 and 5 through 7, in order to prevent $N_2$ gas and $O_3$ gas from entering the lower area of the case 90, a projection part 92 for restricting gas is formed on the bottom surface of the case 90. Specifically, the outer edge of the case 90 vertically extends out downward (toward the turntable 2) along the circumferential direction, thereby forming the projection part 92. The plasma gas supply nozzle 34 is accommodated, on the upstream side in the rotational direction of the turntable 2, in the area that is surrounded by the inner peripheral surface of the projection part 92, the bottom surface of the case 90, and the top surface of the turntable 2.

That is to say, the gas that is supplied from the plasma gas supply nozzle 34 is turned into plasma in the lower area of the case 90 (plasma space 10), and therefore when $N_2$ gas enters the lower area, the plasma of the $N_2$ gas and the plasma of the $O_3$ gas ($O_2$ gas) react with each other and NOx gas is generated. When NOx gas is generated, the members in the processing chamber 1 are corroded. Thus, in order to reduce $N_2$ gas entering the lower area of the case 90, the projection part 92 is formed on the bottom surface of the case 90.

Figure 7:
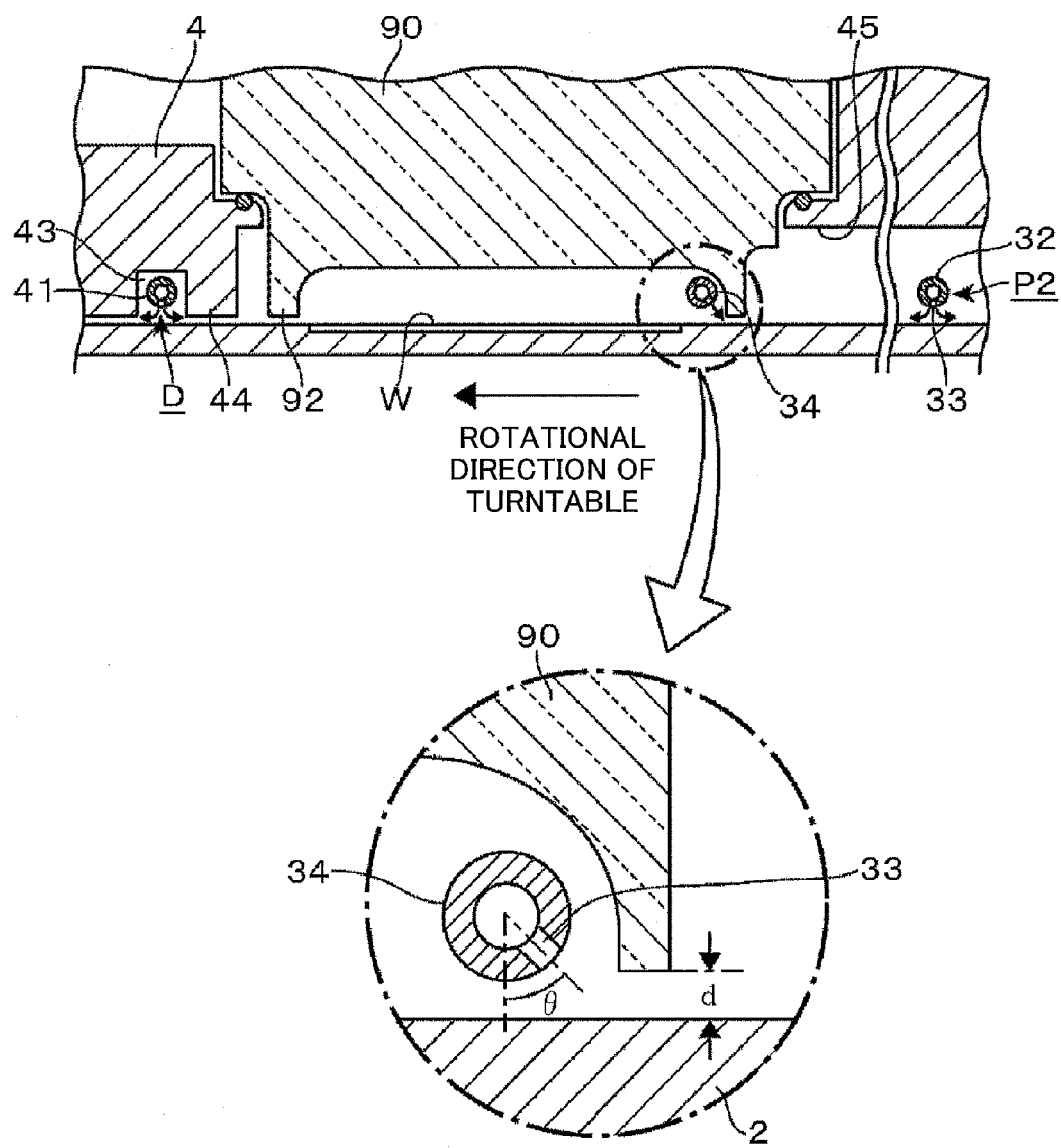
FIG. 7 is a vertical cross-sectional view of part of the inside of the film deposition device to which the plasma processing device according to the first embodiment of the present invention is applied.

The projection part 92 at the rear end of the plasma gas supply nozzle 34 (at the side wall of the processing chamber 1) is cut out into a substantially arc shape along the external shape of the plasma gas supply nozzle 34. The distance between the bottom surface of the projection part 92 and the top surface of the turntable 2 is 0.5 mm through 4 mm (2 mm in this example). The width and the height of the projection part 92 are, for example, 10 mm and 28 mm, respectively. Note that FIG. 7 is a cross-sectional view of the processing chamber 1 cut along the rotational direction of the turntable 2.

Furthermore, during the film deposition process, the turntable 2 rotates in a clockwise direction, and therefore, along with the rotation of the turntable 2, the $N_2$ gas tends to enter the bottom side of the case 90 through a gap between the turntable 2 and the projection part 92. Therefore, in order to reduce the $N_2$ gas entering the bottom side of the case 90 through this gap, gas is discharged from the bottom side of the case 90 to the gap. Specifically, as illustrated in FIGS. 5 and 7, the gas transfer openings 33 of the plasma gas supply nozzle 34 are arranged so as to face toward the gap, i.e., the gas transfer openings 33 are arranged on the upstream side in the rotational direction of the turntable 2 and are arranged to face downward. For example, the angle θ of the direction of the gas transfer openings 33 of the plasma gas supply nozzle 34 with respect to the vertical axis, is approximately 45° as illustrated in FIG. 7.

Here, referring to the O-ring 11d sealing the area between the ceiling 11 and the case 90 from below the case 90 (plasma space 10), as illustrated in FIG. 5, the projection part 92 is formed in the circumferential direction between the plasma space 10 and the O-ring 11d. Therefore, to prevent the O-ring 11d from being directly exposed to plasma, the O-ring 11d is isolated from the plasma space 10. Therefore, when the plasma in the plasma space 10 is diffused toward the side of the O-ring 11d, the plasma passes through the part below the projection part 92, and therefore the plasma is inactivated before reaching the O-ring 11d.

Inside the case 90 (in the area that is caved in downwards in the case 90), a grounded Faraday shield 95 is accommodated, which is formed of a metal plate that is a conductive plate-like body having a thickness k of, for example, approximately 1 mm, which is formed to substantially extend along the inner shape of the case 90. In this example, the Faraday shield 95 is a plate material that is a copper (Cu) plate or a plate material formed by coating a copper plate with a nickel (Ni) film or a gold (Au) film from below. That is to say, the Faraday shield 95 includes a horizontal surface 95a that is formed horizontally along the bottom surface of the case 90, and a vertical surface 95b extending upward along the circumferential direction from the outer peripheral edge of the horizontal surface 95a, and is formed to have a substantially sector-like shape along the inner edge of the case 90 as viewed from above. The Faraday shield 95 is formed by, for example, performing a rolling process on a metal plate, or by bending upward the area of the metal plate corresponding to an area outside the horizontal surface 95a.

Furthermore, the upper edges of the Faraday shield 95 on the right side and the left side as viewed from the rotational center of the turntable 2, respectively horizontally extend toward the right side and the left side, thereby forming support parts 96. Furthermore, when the Faraday shield 95 is accommodated inside the case 90, the bottom surface of the Faraday shield 95 and the top surface of the case 90 contact each other, and the support parts 96 are supported by the flange part 90a of the case 90. On top of the horizontal surface 95a, in order to realize insulation between the Faraday shield 95 and the plasma generation unit 80 placed on the Faraday shield 95, an insulating plate 94 is laminated, which has a thickness of, for example, approximately 2 mm, and which is made of, for example, quartz. In the horizontal surface 95a, multiple slits 97 are formed; the shape and the arrangement layout of the slits 97 are described below together with the description of the electrode 83 of the plasma generation unit 80. Note that the insulating plate 94 is not illustrated in FIGS. 8 and 9 described below.

The plasma generation unit 80 is constituted to be accommodated inside the Faraday shield 95. Thus, as illustrated in FIGS. 4 and 5, the plasma generation unit 80 is arranged so as to face the inside (wafer W on the turntable 2) of the processing chamber 1, via the case 90, the Faraday shield 95, and the insulating plate 94. The plasma generation unit 80 is constituted by winding the electrode 83 around the vertical axis, and two plasma generation units 80, 80 are provided in this example. Each plasma generation unit 81 (80), 82 (80) is formed by winding around the electrode 83 in a triple helix. One of the plasma generation units 80, 80 is referred to as first plasma generation unit 81 and the other one is referred to as a second plasma generation unit 82. As illustrated in FIGS. 4 and 5, the first plasma generation unit 81 has a substantially sector-like shape extending along the inner edge of the case 90 in a planar view. Furthermore, the first plasma generation unit 81 is arranged such that the center part area C and the outer peripheral edge are in close contact with the inner walls of the case 90, so that it is possible to radiate (supply) plasma along the part between the edge of the wafer W on the side of the center part area C and the outer edge part of the turntable 2, when the wafer W is positioned under the first plasma generation unit 81. Note that a flow path through which cooling water flows is formed inside the electrode 83, although not illustrated.

As described above, by a configuration in which the electrode 83 of the plasma generation unit 80 is arranged outside the processing chamber 1, and electric fields and magnetic fields are introduced inside the processing chamber 1 from outside, the electrode 83 is not arranged inside the processing chamber 1. Therefore, it is possible to prevent metal contamination inside the processing chamber 1, so that high-quality films can be deposited. However, because the case 90 is a dielectric body made of high-purity quartz, compared to a configuration in which the electrode 83 is inside the processing chamber 1, there are cases where it is difficult to cause plasma discharge. According to the film deposition device according to an embodiment of the present invention, a film deposition device and an operation method thereof are provided, which are capable of stably causing plasma discharge, with a configuration in which the electrode 83 is provided outside the processing chamber 1; details thereof are given below.

In order to supply plasma to the wafer W on the outer peripheral side in the radial direction of the turntable 2, the second plasma generation unit 82 is arranged between a position that is spaced apart from the center position of the wafer W on the turntable 2 by approximately 200 mm toward the outer peripheral side, and a position that is spaced apart from the outer edge of the turntable 2 by approximately 90 mm toward the outer peripheral side. That is to say, when the turntable 2 rotates, the circumferential velocity is higher at the outer peripheral side compared to the center part side. Thus, the amount of plasma supplied to the wafer W may be less at the outer peripheral side than at the inner peripheral side. Therefore, in order to supply the same amount of plasma to the wafer along the radial direction of the turntable 2, i.e., in order to compensate the amount of plasma supplied to the wafer W by the first plasma generation unit 81, the second plasma generation unit 82 is provided.

The electrodes 83 included in the first plasma generation unit 81 and the second plasma generation unit 82, are separately connected to a high frequency power source 85 via a matching box 84. The high frequency power source 85 has a frequency of, for example, 13.56 MHz, and output power of, for example, 5000 W. Accordingly, the high frequency power can be separately adjusted for the first plasma generation unit 81 and the second plasma generation unit 82. Note that in FIG. 3, the matching box 84 and the high frequency power source 85 are illustrated in a simplified manner. Furthermore, in FIGS. 1, 3, and 4, a connection electrode 86 is illustrated, for electrically connecting the first and second plasma generation units 81, 82 and the high frequency power source 85.

Here, the high frequency power source 85 is able to change the output (hereinafter, also simply referred to as "high frequency output") of high frequency power supplied to the electrode 83. The output of the high frequency power source 85 is set at, for example, 3300 W, for a plasma process for regular film deposition in a processing room of 600° C. and at 1.8 Torr. In the plasma processing device and the operation method thereof according to the present embodiment, when resuming the operation after the operation of the film deposition device has stopped for a long while, for example, when performing a plasma process when more than thirty minutes have passed since the previous film deposition process has ended, a charge storage process is performed before the film deposition process. The charge storage process is performed by supplying, to the electrode 83, high frequency power of a lower output than the high frequency power supplied to the electrode 83 in a regular film deposition process. The charge storage process includes storing charges in the processing chamber 1 formed by a dielectric body such as quartz, to create a state where plasma discharge is easily caused inside the processing chamber 1. While a plasma process is performed inside the processing chamber 1, or immediately after the plasma process has ended, charges are stored in the case 90 above the plasma generation unit 80, and therefore if high frequency power is supplied to the electrode 83, plasma discharge is easily caused. However, if a long time period passes, the charges escape from the case 90, and even if high frequency power is applied to the electrode 83 to perform the regular plasma process, plasma discharge is not caused. Therefore, the plasma processing device and the operation method thereof according to the present embodiment supplies, to the electrode 83, high frequency power of a lower output than the high frequency power used for a regular plasma process, and charges are stored in the case 90 via the electrode 83, so that plasma discharge can be easily caused, and then the actual plasma process is performed.

Supposing that the plasma process is performed at 3300 W, the high frequency power supplied to the electrode 83 in the charge storage process is approximately 700 W through 1500 W, which is less than half of that of the plasma process. Accordingly, it is possible to prevent accidental discharges, and gradually store charges in the case 90, and prepare conditions under which the plasma process can be performed by high frequency power of a low output. Thus, the high frequency power source 85 is constituted as an output variable type high frequency power source 85 that can vary the output of the high frequency power to various levels.

Next, a detailed description is given of the slits 97 of the Faraday shield 95. Among the electric field and magnetic field (electromagnetic field) generated in the first plasma generation unit 81 and the second plasma generation unit 82, the slits 97 prevent the electric field components from moving toward the wafer W positioned below, and also causes the magnetic field to reach the wafer W. That is to say, if the electric field reaches the wafer, the electric wiring formed inside the wafer W may be electrically damaged. Meanwhile, the Faraday shield 95 is constituted by a grounded metal plate, and therefore unless slits 97 are formed, the electric field as well as the magnetic field will be blocked. Furthermore, if a large opening is formed at the bottom of the electrode 83, the magnetic field as well as the electric field will pass. Therefore, in order to block the electric field but pass the magnetic field, the slits 97 are formed having the following size and arrangement layout.

Figure 8:
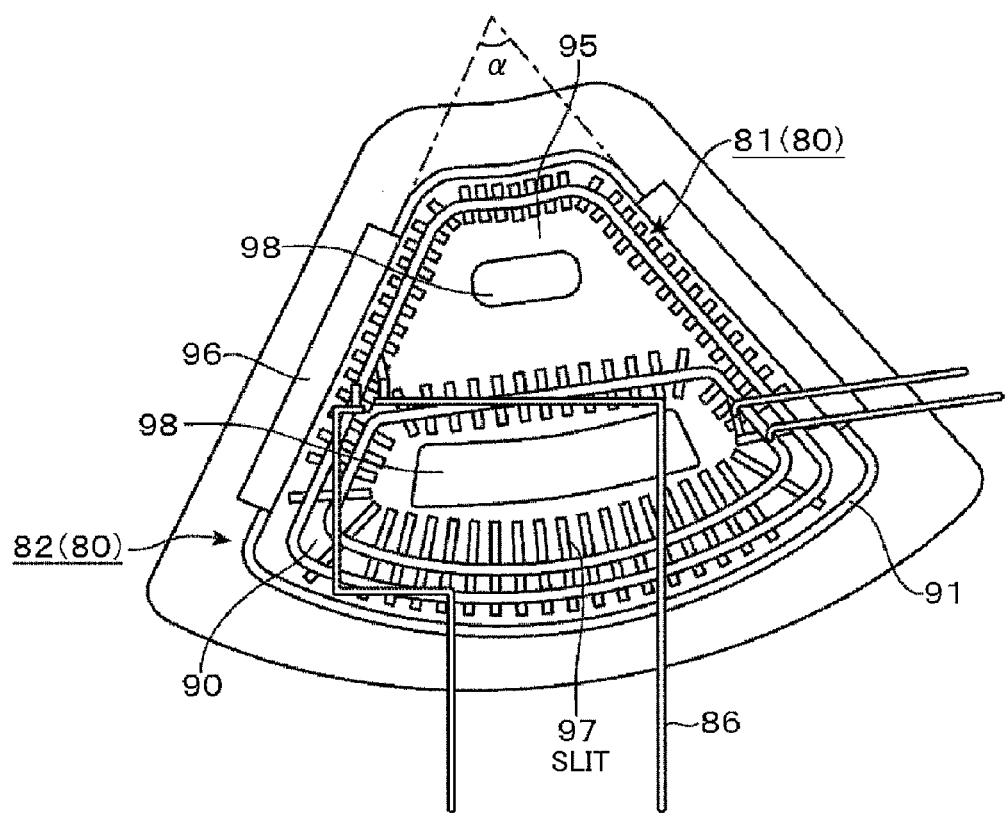
FIG. 8 is a planar view of part of the inside of the film deposition device to which the plasma processing device according to the first embodiment of the present invention is applied.

Specifically, as illustrated in FIG. 8, the slits 97 are formed at the bottom position of the electrode 83 across the circumferential direction, extending in a direction orthogonal to the winding direction of each of the electrodes 83 of the first plasma generation unit 81 and the second plasma generation unit 82. Therefore, for example, in the area where the electrode 83 is arranged along the radial direction of the turntable 2, the slits 97 are formed in a linear shape or in an arc shape along the tangent line direction or the circumferential direction of the turntable 2. Furthermore, in the area where the electrode 83 is placed in an arc shape along the outer edge of the turntable 2, the slits 97 are formed in a linear shape directed from the rotational center toward the outer edge of the turntable 2. Furthermore, at the part where the electrode 83 bends between the two areas, the slits 97 are formed in a tilted direction with respect to the circumferential direction and the radial direction of the turntable 2, so as to be orthogonal with respect to the direction in which the electrode 83 extends at the bending part. Therefore, multiple slits 97 are arranged along the direction in which the electrode 83 extends.

Here, to the electrode 83, the high frequency power source 85 having a frequency of 13.56 MHz is connected as described above. The wavelength that corresponds to this frequency is 22 m. Therefore, the slits 97 are formed to have a width that is approximately less than or equal to 1/10000 of this wavelength, i.e., as illustrated in FIG. 9, to have a width d1 of 1 mm through 5 mm (2 mm in this example), and have a space d2 between the slits 97, 97 of 1 mm through 5 mm (2 mm in this example). Furthermore as illustrated in FIG. 8, the multiple slits 97 are formed in an area ranging from a position that is approximately 30 mm away from the right edge of the electrode 83 to the right side, to a position that is approximately 30 mm away from the left edge of the electrode 83 to the left side, such that the slits 97 are formed to have a length of 60 mm as viewed from the direction in which the electrode 83 extends. The area outside the area where the slits 97 are formed, i.e., on the center side of the area where the electrode 83 is wound around, openings 98 are formed in the Faraday shield 95 at the rotational center side and the outer peripheral side of the turntable 2. Note that in FIG. 3, the slits 97 are not illustrated. Furthermore, in FIGS. 4 and 5, the slits 97 are illustrated in a simplified manner; however, for example, actually about 150 slits 97 are formed. The slits 97 are actually formed such that the width d1 increases from the area in close contact with the opening 98 toward the area that is away from the opening 98; however, in the figures, the slits 97 are not illustrated in this shape.

Figure 10:
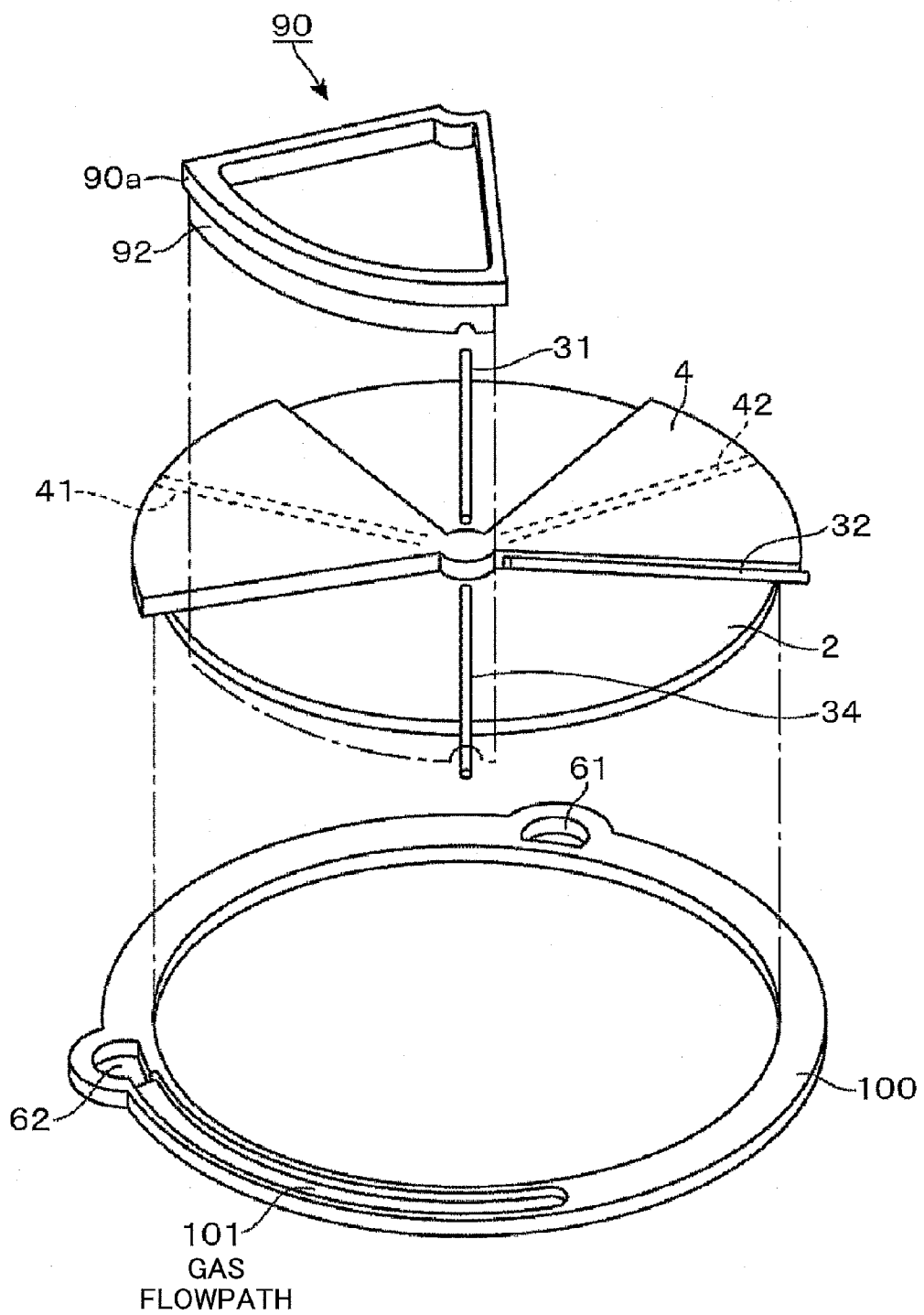
FIG. 10 is an exploded perspective view of a side ring of the film deposition device to which the plasma processing device according to the first embodiment of the present invention is applied.

Next, the description of the elements of the processing chamber 1 is continued. At a position that is slightly lower than the turntable 2 on the outer peripheral side of the turntable 2, as illustrated in FIGS. 2, 5, and 10, a side ring 100 that is a cover body is arranged. For example, the side ring 100 is used for protecting the inner walls of the processing chamber 1 from cleaning gas, when the device is cleaned and fluorinated cleaning gas flows in the device instead of processing gas. That is to say, unless the side ring 100 is provided, between the outer peripheral part of the turntable 2 and the inner walls of the processing chamber 1, a recessed airflow passage in which an airflow (exhaust flow) is formed in the horizontal direction is formed in a ring shape along the circumferential direction. Therefore, the side ring 100 is provided in the airflow passage, such that the inner walls of the processing chamber 1 are not exposed to the airflow passage as much as possible. In this example, the separation area D and the area on the outer edge side of the case 90 are exposed to the upper side of this side ring 100.

On the top surface of the side ring 100, exhaust openings 61, 62 are formed at two locations that are spaced apart from each other in the circumferential direction. In other words, two exhaust openings are formed on the lower side of the airflow passage, and the exhaust openings 61, 62 are formed in the side ring 100 at positions corresponding to the exhaust openings of the airflow passage. Among these two exhaust openings 61, 62, one is referred to as a first exhaust opening 61 and the other one is referred to as a second exhaust opening 62. The first exhaust opening 61 is formed at a position shifted toward the separation area D, between the first processing gas nozzle 31 and the separation area D at the downstream side in the rotational direction of the turntable 2 with respect to the first processing gas nozzle 31. The second exhaust opening 62 is formed at a position shifted toward the separation area D, between the plasma gas supply nozzle 34 and the separation area D at the downstream side in the rotational direction of the turntable 2 with respect to the plasma gas supply nozzle 34.

The first exhaust opening 61 is for exhausting first processing gas and separation gas, and the second exhaust opening 62 is for exhausting second processing gas, separation gas, and also plasma generation gas. As illustrated in FIG. 1, the first exhaust opening 61 and the second exhaust opening 62 are connected to, for example, a vacuum pump 64, which is a vacuum exhaust mechanism, by an exhaust pipe 63 provided with a pressure adjustment unit 65 such as a butterfly valve.

Here, as described above, the case 90 is provided from the center part area C to the outer edge side of the turntable 2. Therefore, when various kinds of gas, which are discharged to the upstream side in the rotational direction of the turntable 2 with respect to the case 90, the gas flow moving toward the second exhaust opening 62 is restricted by the case 90. Thus, on the top surface of the side ring 100 at the outside of the case 90, there is formed a gas flow path 101 shaped as a gap through which the second processing gas and the separation gas flow. Specifically, as illustrated in FIG. 3, the gas flow path 101 is formed in an arc shape such that the depth is, for example, 30 mm, from a position closer to the second processing gas nozzle 32 by, for example, approximately 60 mm, than the edge of the upstream side in the rotational direction of the turntable 2 of the case 90, to the second exhaust opening 62. Therefore, the gas flow path 101 is formed so as to extend along the outer edge of the case 90, and to extend across the outer edge part of the case 90 as viewed from above. Although not illustrated, the surface of this side ring 100 is coated by, for example, alumina, or is covered by a quartz cover, for the purpose of applying a corrosion resistance property with respect to fluorinated gas.

As illustrated in FIG. 2, in the center part of the bottom surface of the ceiling 11, a protrusion part 5 is provided. Specifically, the protrusion part 5 is formed in a substantially ring shape along the circumferential direction in continuation with the part on the side of the center part area C of the sector-like portion 4, and the bottom surface of the protrusion part 5 is formed to be at the same height as the bottom surface of the sector-like portion 4 (ceiling face 44). Above the core part 21 closer to the rotational center side of the turntable 2 than the protrusion part 5, the labyrinth structure part 110 is arranged, which is for preventing the first processing gas and the second processing gas from mixing with each other at the center part area C. That is to say, as illustrated in FIG. 1, the case 90 is formed up to a position close to the center part area C side, and therefore in the core part 21 supporting the center part of the turntable 2, the part above the turntable 2 is formed at a position closer to the rotational center to avoid the case 90. Therefore, for example, the different types of processing gas are easily mixed with each other on the center part area C side, more so than on the outer edge part side. Thus, by forming the labyrinth structure part 110, the gas flow path is extended and the different types of processing gas are prevented from being mixed with each other.

As illustrated in FIG. 1, in the space between the turntable 2 and the bottom surface part 14 of the processing chamber 1, a heater unit 7 that is a heating mechanism is provided. For example, the heater unit 7 heats the wafer W on the turntable 2 to 300° C., through the turntable 2. FIG. 1 illustrates a cover member 71a provided on the side of the heater unit 7, and a hood member 7a covering the upper side of the heater unit 7. Furthermore, on the bottom surface part 14 of the processing chamber 1, below the heater unit 7, purge gas supply pipes 73 for purging the space where the heater unit 7 is arranged, are provided at a plurality of positions along the circumferential direction.

On the side wall of the processing chamber 1, as illustrated in FIGS. 2 and 3, the transfer opening 15 is formed for receiving and passing wafers W, between an external transfer arm (not illustrated) and the turntable 2. This transfer opening 15 can be opened and closed in a gastight manner by a gate valve G. Furthermore, in the recessed portions 24 of the turntable 2, as wafers W are passed between the transfer arm and the turntable 2 at the position before the transfer opening 15, at the part corresponding to the position where the wafers W are passed below the turntable 2, a lift pin for passing the wafer by lifting the wafer W from behind the wafer W, through the recessed portions 24 is provided, and a lift mechanism for the lift pin is provided (neither are illustrated).

Furthermore, as illustrated in FIG. 1, the film deposition device is provided with a control unit 120 constituted by a computer for controlling the operations of the entire device. The control unit 120 includes a CPU (Central Processing Unit) 121, a memory 122, and a timer 123. The memory 122 of the control unit 120 stores programs for performing a film deposition process and a modifying process described below. The CPU 121 reads these programs and executes the programs. These programs include a group of steps for executing operations of the device described below, and the programs are installed in the memory 122 in the control unit 120 from a storage unit 125 which is a storage medium such as a hard disk, a compact disk, a magnetic optical disk, a memory card, and a flexible disk.

The control unit 120 controls the entire film deposition process including a plasma process according to a process recipe, and also controls the above-described charge storage process, i.e., implements charge storage control. The charge storage control of the charge storage process is control for creating a state where plasma discharge is easily caused by storing charges in the case 90, before the film deposition process including a regular plasma process, when a time interval exceeding a predetermined time interval has passed since the last plasma process has been performed. Thus, in order to measure the elapsed time from the previous plasma process, the control unit 120 may include the timer 123 as a time measuring unit. Note that the time measuring unit may be built in the control unit 120 as the timer 123, or may be provided outside the control unit 120 so that the control unit 120 refers to an external time measuring unit. FIG. 1 illustrates an example where the timer 123 is built in the control unit 120 as a time measuring unit. Furthermore, the time measuring unit may be any means other than the timer 123 as long as the time can be measured.

Furthermore, the specific control/process contents of the charge storage control may be provided as a conditioning recipe, similar to a process recipe. For example, the conditioning recipe and the process recipe may be installed in the memory 122 in the control unit 120 from the storage unit 125, and may be executed by the CPU 121.

The film deposition device is activated with an operation switch 130. When the operator switches on the operation switch 130, an instruction signal to start operation is input to the control unit 120, and the control unit 120 controls the elements of the film deposition device; in the film deposition device according to the present embodiment, the above-described charge storage control is implemented according to need. Specifically, when the operation switch 130 is operated and an instruction to activate the film deposition device is given, the control unit 120 refers to the time measuring unit 123 and determines whether a predetermined time interval has passed from the last film deposition process (plasma process). For example, the predetermined time interval may be set to be an appropriate value ranging from 20 minutes to 5 hours; for example, at 30 minutes. When the control unit 120 determines that a predetermined time interval has passed from the last film deposition process, the control unit 120 executes charge storage control and causes the film deposition device to perform a charge storage process. Specifically, without introducing the processing gas used for depositing films, the control unit 120 implements control of supplying, from the high frequency power source 85 to the electrode 83, predetermined high frequency power of a lower output than that used for film deposition.

Furthermore, FIG. 1 illustrates an abnormality alarm unit 150. The abnormality alarm unit 150 is for emitting an abnormality alarm to report an abnormality to the operator, when an abnormality occurs in the film deposition device or in the process itself during the film deposition process. FIG. 1 illustrates a speaker 151 and an alarm lamp 152, as specific examples of the abnormality alarm unit 150. That is to say, when an abnormality occurs, an abnormality alarm is emitted by sound from the speaker 151, and an abnormality alarm is visually emitted by the alarm lamp 152. The abnormality alarm is configured to operate according to an instruction from the control unit 120 when the control unit 120 detects an abnormality.

In the film deposition device according to the present embodiment, an abnormality alarm may not only be emitted when an abnormality occurs in the film deposition process, but also in the charge storage process. In the charge storage process, in order to further ensure that plasma discharge is caused in the film deposition process, in addition to merely storing charges in the case 90, the charge storage process is preferably performed until plasma discharge is caused. In the charge storage process, high frequency power is intermittently supplied from the high frequency power source 85 to the electrode 83, in units of seconds ranging from several tenths of a second through several seconds. That is to say, the charge storage process is performed by repeating several times the operation of supplying high frequency power to the electrode 83 for a predetermined time period in units of seconds, and then supplying high frequency power to the electrode 83 after a predetermined time interval in units of seconds. At this time, according to need, control is implemented to gradually increase the output of the high frequency power to be supplied. For example, high frequency power of 700 W is first supplied to the electrode 83, and then high frequency power of 800 W is supplied to the electrode 83, and then high frequency power of 900 W is supplied to the electrode 83. In this manner, control is implemented to cause plasma discharge by gradually increasing the output of the supplied high frequency power. The high frequency power is supplied until plasma discharge is caused. In this case, the maximum output of high frequency power is set in advance, and when the output reaches the predetermined maximum high frequency power for charge storage, the maximum high frequency power is intermittently supplied to the electrode 83. The frequency of intermittently supplying the maximum high frequency power to the electrode 83 is set to be a predetermined number of times set in advance. When plasma is not generated even by supplying the maximum high frequency power to the electrode 83 for the predetermined number of times, it is determined that there is some abnormality, and the control unit 120 controls the abnormality alarm unit 150 to activate an abnormality alarm.

As described above, the abnormality alarm unit 150 may not only be used at the time of the film deposition process, but also when implementing charge storage control.

Furthermore, the film deposition device according to the present embodiment includes a discharge detector 140. The discharge detector 140 is a sensor for detecting the plasma discharge, and is provided, for example, above the case 90.

For example, the discharge detector 140 may be a sensor for detecting a brightness of greater than or equal to a predetermined luminance. When plasma discharge is caused, the plasma space 10 becomes bright. Therefore, by arranging the discharge detector 140 for detecting brightness above the case 90, it is possible to detect that the brightness is greater than or equal to a predetermined luminance through a plasma window of the of the case 90 because the case 90 is transparent. Accordingly, it is possible to detect that plasma discharge has been caused.

Note that the detection signals of the discharge detector 140 are sent to the control unit 120, and are used for the charge storage control performed by the control unit 120.

Next, a description is given of an operation method of the plasma processing device according to an embodiment of the present invention. The above-described film deposition device is given as an example in describing the plasma processing device. Furthermore, the elements described above are denoted by the same reference numerals and descriptions thereof are omitted.

Figure 11:
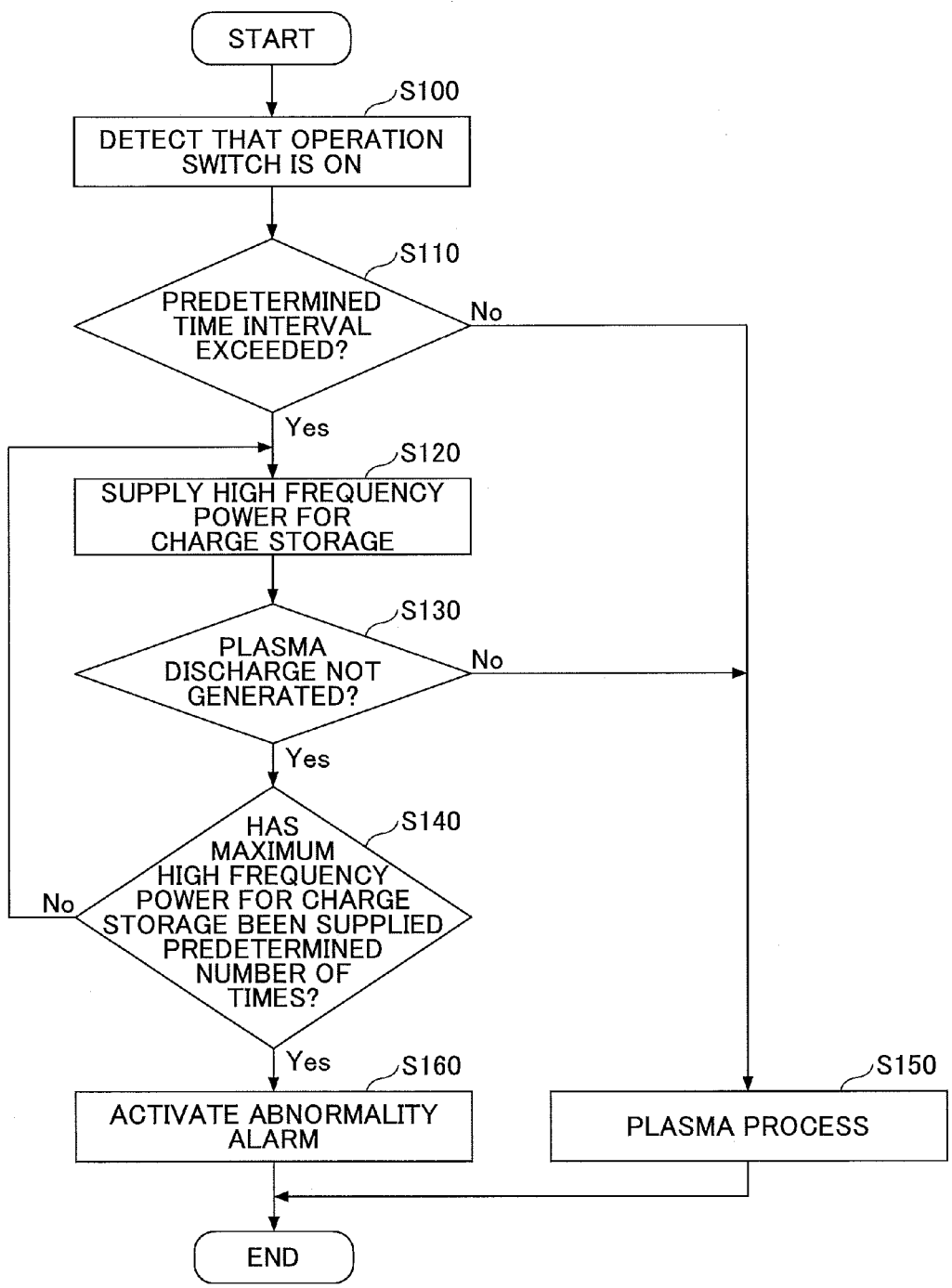
FIG. 11 illustrates an example of a process flow of an operation method of the plasma processing device according to the first embodiment of the present invention.

FIG. 11 illustrates an example of a process flow of an operation method of the plasma processing device according to a first embodiment of the present invention.

In step S100, the control unit 120 detects that the operation switch 130 (FIG. 1) has been switched on. The operation switch 130 may be operated by the operator, or the operation switch 130 may be automatically switched on. When the operation switch 130 is switched on, an operation switch-on signal is sent to the control unit 120 and the control unit 120 detects that the operation switch 130 has been switched on.

In step S110, the control unit 120 determines whether the time interval from when the plasma processing device (film deposition device) has previously ended operating, to when the switch-on of the operation switch 130 is detected, has exceeded a predetermined time interval. The end time of the previous operation of the plasma processing device may be measured by the timer 123 and stored in the memory 122. Then, when the switch-on of the operation switch 130 is detected, the CPU 121 calculates the time interval between the end time of the previous operation stored in the memory 122 and the operation switch-on time, and the control unit 120 may determine whether the calculated time interval exceeds a predetermined time interval that has been set in advance.

The predetermined time interval may be set based on the time interval by which plasma discharge becomes difficult when the plasma processing device starts operating under the operation conditions of a regular plasma process. For example, if plasma generation becomes difficult when 30 minutes pass from the end time of the previous operation, the predetermined time interval may be set at 30 minutes. As described above, an appropriate time interval may be individually set as the predetermined time interval, according to the plasma processing device and the process contents. For example, when a $SiO_2$ film is deposited under high temperature high pressure conditions of 600° C. and 1.8 Torr with the above film deposition device by an ALD method, generation of plasma becomes difficult when there is a time interval of greater than or equal to 30 minutes. Therefore, in this case, the predetermined time interval may be set at 30 minutes. Furthermore, in the case of a plasma processing device and a plasma processing process where plasma discharge becomes difficult after a time interval of two hours, the predetermined time interval may be set at two hours. As described above, various times may be set as the predetermined time interval according to the purpose; for example, the predetermined time interval may be set within a range of 30 minutes through 5 hours.

In step S110, when the control unit 120 determines that the switch-on time of the operation switch 130 exceeds the predetermined time interval, the process proceeds to step S120. Meanwhile, when the control unit 120 determines that the switch-on time of the operation switch 130 does not exceed the predetermined time interval, the process proceeds to step S150 to shift to the plasma process (film deposition process), without implementing charge storage control. This is because it is considered that the time interval is short, and therefore plasma can be generated without any problems by directly performing the regular operation without implementing charge storage control.

In step S120, according to an instruction from the control unit 120, predetermined high frequency power for charge storage is supplied from the high frequency power source 85 to the electrode 83. The predetermined high frequency power for charge storage has a lower output than the high frequency power that is supplied in the actual plasma process. For example, in a $SiO_2$ film deposition process in which the temperature in the processing chamber 1 is 600° C., the pressure is 1.8 Torr, Si gas and $O_3$ gas are used as the processing gas, and Ar and $NH_3$ is used as the plasma gas, and a plasma processing process of applying a high frequency of 3300 W to the electrode 83, the high frequency power for charge storage is supplied starting from a level where plasma is unlikely to be generated, such as 700 W or 800 W.

Note that the predetermined high frequency power for charge storage is preferably intermittently supplied a plurality of times, assuming the each time is approximately several tenths of a second through several seconds. If the high frequency power is applied for a long time, there may be cases where an abnormality occurs in the matching function of the matching box 84. Therefore, the high frequency power for charge storage is supplied to electrode 83 for a maximum of less than or equal to several seconds each time.

Note that in the process flow of FIG. 11, in step S120, the high frequency power for charge storage is supplied only once. That is to say, when the high frequency power for charge storage is intermittently supplied to the electrode 83 for a plurality of times, in the process flow, steps S120 through S140 are repeated for a number of times corresponding to the number of times the high frequency power is to be supplied. However, as a matter of ease of understanding, the method of supplying the high frequency power for charge storage is described in this step (step S120), and therefore the case of supplying the high frequency power for charge storage for a plurality of times is also described in this step.

When supplying the high frequency power for charge storage for a plurality of times, it is preferable to start supplying the power at a low output, and then gradually increasing the output. For example, the high frequency power is preferably gradually increased, such as starting from supplying the power at 700 W, supplying the power at 800 W in the next time, supplying the power at 900 W in the next time, supplying the power at 1000 W in the next time, and supplying the power at 1500 W in the next time. When the plasma processing device is continuously operated and plasma discharge is continuously caused, charges are stored on the inner walls of the case 90 that is a dielectric body, and the plasma processing device is in a state where discharge easily occurs. However, when a certain amount of time passes after the operation ends, these charges move away from the vicinity of the case 90, and the charges disappear from the case 90. Particularly, when a process of high temperature of approximately 600° C. is performed, the temperature difference is large between the inside of the processing chamber 1 which is at a high temperature and the outside of the processing chamber 1 which is at room temperature. However, the charges tend to move from a location of high temperature to a location of low temperature. Thus, a large amount of charges move from the inner walls of the case 90 to the outside of the processing chamber 1, and not much charges remain on the inner walls of the processing chamber 1. Therefore, in the charge storage process, it is necessary to restore the state where charges are stored from the state where charges have disappeared. However, the electrode 83 is the only location where high frequency power can be supplied, and therefore the charges are preferably gradually supplied through the electrode 83 to be stored inside the processing chamber 1 including the case 90. In the charge storage process, in order to confirm that the inside of the processing chamber 1 has completely returned to a state where plasma can be generated, it is preferable to cause plasma discharge by using high frequency power of a low output used in the charge storage process. In order to cause plasma discharge, a sufficient amount of charges need to be stored on the inner walls of the processing chamber 1. In order to attain this, the charges are preferably surely and quickly stored, by first storing the charges in the electrode 83, and then storing the charges in the case 90, and so forth. Thus, in the operation method of the plasma processing device according to the present embodiment, high frequency power is first supplied at an output by which discharge does not occur, and then the high frequency power is gradually increased, thereby surely and quickly causing plasma discharge at low output.

In step S130, it is determined whether plasma discharge has not been caused. When plasma discharge has been caused, the discharge detector 140 detects the discharge, the discharge detector 140 sends discharge detection signals to the control unit 120, and the control unit 120 determines that plasma discharge has been caused. Meanwhile, when discharge is not detected by the discharge detector 140 and the control unit 120 does not receive discharge detection signals, the control unit 120 determines that plasma discharge has not been caused.

In step S130, when the control unit 120 determines that plasma discharge has been caused, the objective of the charge storage process is achieved, which is turning the inside of the processing chamber 1 into a state where plasma can be generated. Therefore, the process proceeds to step S150, and the plasma process such as film deposition that is the objective, is performed. Meanwhile, when the control unit 120 determines that plasma discharge has not been caused, the process proceeds to step S140.

In step S140, in the charge storage process, the control unit 120 determines whether the maximum high frequency power for charge storage set as the maximum high frequency power, has been supplied to the electrode 83 for a predetermined number of times which is set as the maximum number of times of supplying power. The maximum high frequency power for charge storage is the maximum output of high frequency power used in the charge storage process. Basically, plasma discharge is set to be caused inside the processing chamber 1 by the time the maximum high frequency power for charge storage has been intermittently supplied for a predetermined number of times. Thus, when plasma discharge is not caused after supplying this power to the electrode 83 for a predetermined number of times, it is considered that some kind of abnormality has occurred in the plasma processing device.

Thus, in step S140, when it is determined that plasma discharge has not been caused even by supplying, to the electrode 83, the maximum high frequency power for charge storage for a predetermined number of times which is set as the maximum number of times of supplying the power, the process proceeds to step S160, an abnormality alarm is activated, and the process flow ends. Furthermore, the abnormality alarm may be activated as the control unit 120 sends an operation instruction to the abnormality alarm unit 150 and the speaker 151 and the alarm lamp 152 emit the abnormality alarm.

Meanwhile, when the control unit 120 determines that the high frequency power source 85 has not output the maximum high frequency power for charge storage, or the control unit 120 determines that even when the high frequency power source 85 has output the maximum high frequency power for charge storage, the maximum number of times is not yet reached, the process returns to step S120, and after a predetermined time interval, the next high frequency power for charge storage is supplied to the electrode 83.

Steps S120 through S140 are repeated until it is determined in step S130 that plasma discharge has been caused or it is determined in step S140 that the maximum high frequency power for charge storage has been supplied for the maximum number of times. Furthermore, in step S120, every time the steps are repeated, settings of the high frequency power are made according to need, such as gradually increasing the output of the high frequency power for charge storage, or continuously supplying the maximum high frequency power for charge storage.

As described above, in the charge storage process, when plasma discharge is caused, it is determined that preparation for performing the actual plasma processing process has been made, and the charge storage process is ended. Meanwhile, when plasma discharge is not caused even by performing the maximum charge storage process, it is determined that there is an abnormality and the plasma processing device is checked, and the charge storage process is ended. By performing the charge storage process, it is possible to surely cause plasma discharge in the plasma processing process that is the objective, and it is possible to surely prevent any defective products from being produced due to the lack of plasma discharge.

Figure 12:
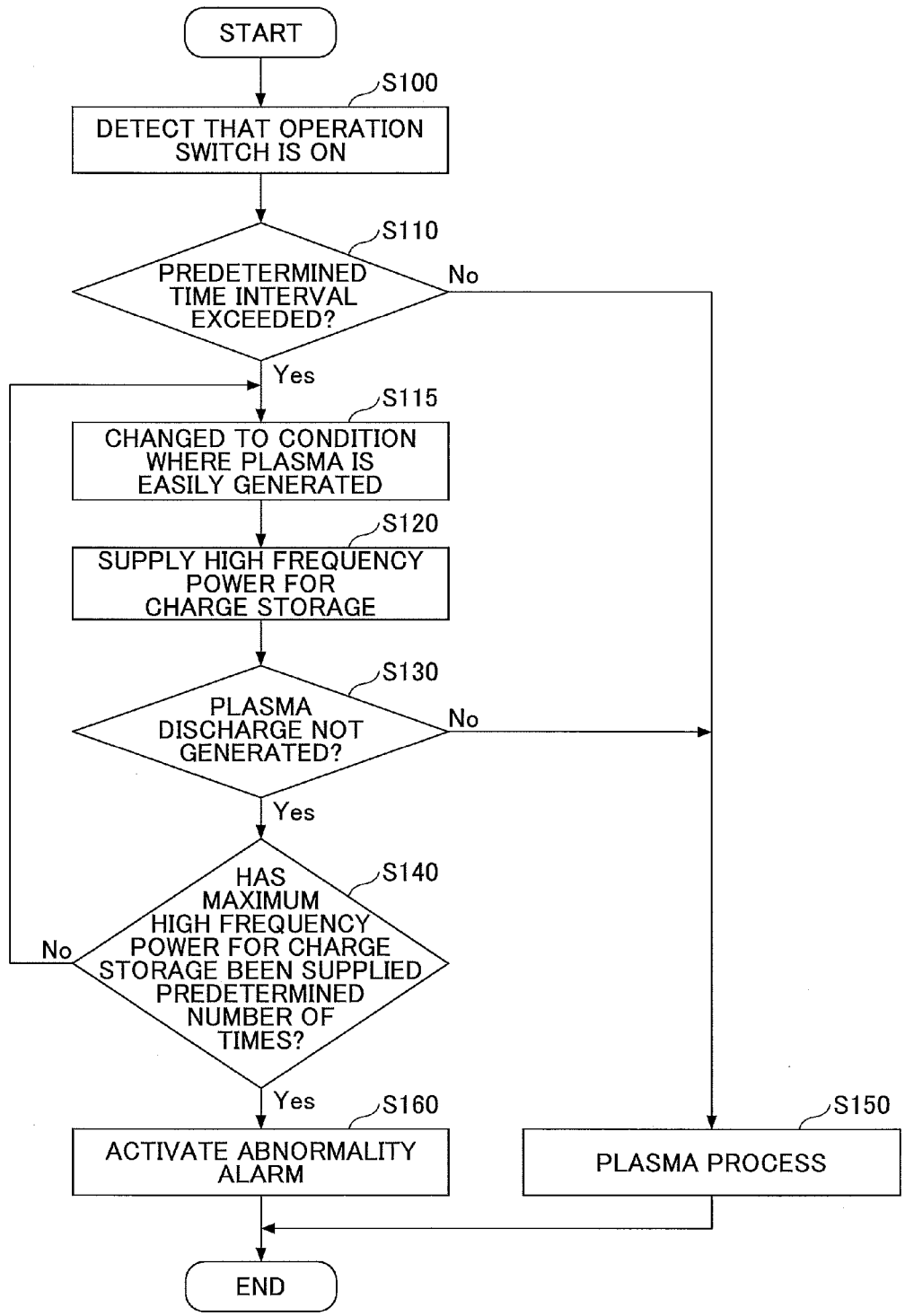
FIG. 12 illustrates an example of a process flow of an operation method of the plasma processing device according to a second embodiment of the present invention.

FIG. 12 illustrates an example of a process flow of an operation method of a plasma processing device according to a second embodiment of the present invention. The operation method of the plasma processing device according to the second embodiment is different from the operation method of the plasma processing device according to the first embodiment illustrated in FIG. 11, only in that step S115 is added.

The contents of steps S100 and S110 are the same as those of FIG. 11, and therefore descriptions thereof are omitted.

In step S110, when the control unit 120 determines that the stop time of the plasma processing device has exceeded the predetermined time interval, the process proceeds to step S115.

In step S115, the control unit 120 changes the process conditions to conditions by which plasma discharge is caused more easily than in the actual plasma processing process. Specifically, plasma discharge is caused more easily under low pressure than under high pressure. That is to say, in the film deposition process, it is necessary to make the inside of the processing chamber 1 high pressure in order to enhance the adhesiveness of the film. However, when only plasma discharge is to be caused without performing the film deposition process, plasma can be generated more easily by making the inside of the processing chamber 1 have lower pressure compared to the case of performing the film deposition process. Thus, for example, when the film deposition process is performed by setting the pressure inside the processing chamber 1 to 1.8 Torr, the pressure is reduced to be set at 1.0 Torr to perform the charge storage process. Accordingly, in the charge storage process, plasma discharge can be caused within a shorter amount of time, and the charge storage process can be quickly ended and perform the plasma processing process (film deposition process) that is the actual objective. Note that the pressure inside the processing chamber 1 can be changed by controlling the pressure adjustment unit 65 by the control unit 120 to adjust the pressure inside the processing chamber 1 to be a predetermined pressure for the charge storage process.

Furthermore, in order to make it easy for plasma discharge to be caused, plasma gas having a mixture ratio that is different from that of the plasma processing process may be used, or plasma gas that is different from that used in the plasma processing process may be used. For example, when a mixed gas of Ar and $O_3$ is used as the plasma gas in the plasma processing process (film deposition process), the type of gas may be changed in the charge storage process by using a mixed gas of Ar and $NH_3$ as the plasma gas. For example, note that the plasma gas may be changed as the control unit 120 gives an instruction to change the type of gas to a flow rate control valve provided in the plasma gas supply line, or to a switching valve for switching the plasma gas supply source.

As described above, in this step, it is possible to make various changes to set a condition in which plasma discharge can be caused more easily than in the plasma processing process, so that the time taken until plasma is generated can be reduced. Note that in the above description, an example is given of changing the pressure inside the processing chamber 1 and the plasma gas; however, the conditions of other items can also be changed in this step for making it easy to generate plasma.

After the condition is changed in step S115, the process proceeds to step S120. In step S120, the high frequency power for charge storage is applied from the high frequency power source 85 to the electrode 83; however, beyond this, steps S120 through S160 are the same as those of FIG. 11. Therefore, these steps are denoted by the same step numbers and descriptions thereof are omitted.

According to the operation method of the plasma processing device according to the second embodiment, in the charge storage process, plasma discharge can be caused within an even shorter amount of time, and it is possible to shift to the plasma processing process even more quickly.

Note that in the first and second embodiments, a description is given of an example where high frequency power for charge storage is applied to the electrode 83 until plasma discharge is caused in the charge storage process. However, even in a case where plasma discharge is not caused in the charge storage process, it is possible to achieve a certain effect of facilitating the plasma discharge in the plasma processing process by storing charges on the inner walls of the processing chamber 1, and therefore it is not essential to cause plasma discharge in a charge storage process.

[Experiment Results]

Next, a description is given of results of an experiment that has been conducted for checking how plasma is generated when plasma becomes difficult to generate, in a plasma processing device.

FIG. 13 is a table indicating the conditions used in the experiment. As indicated in FIG. 13, the main conditions are that the temperature in the processing chamber 1 is 600° C., the pressure is 1.8 Torr, the rotational speed is 10 rpm, and the types of plasma gas and flow rate are 15000 sccm of Ar gas and 100 sccm of $NH_3$ gas. Furthermore, the high frequency power source 85 is variable, and the electric conduction property of the cooling water for cooling the electrode 83 is 1.5 mS/m. Furthermore, the oscilloscope evaluates the discharge at a sampling cycle of 0.004 sec, and $N_2$ gas is supplied to a purge area such as a separation area.

FIGS. 14A and 14B illustrate the comparison of plasma discharge when the inside of the processing chamber 1 is 400° C. and 600° C. FIG. 14A illustrates plasma discharge in a case when the inside of the processing chamber 1 is 400° C., and FIG. 14B illustrates plasma discharge in a case when the inside of the processing chamber 1 is 600° C.

In FIGS. 14A and 14B, the horizontal axis indicates a time T (seconds), and the vertical axis indicates the Peak to Peak value (amplitude value between maximum value and minimum value) Vpp [V] of the voltage applied to both ends of the electrode 83. In both FIGS. 14A and 14B, the peak of the waveform indicates the timing when plasma discharge is caused; both figures indicate that plasma discharge is caused within 0.05 seconds by applying a high frequency voltage of less than or equal to 6000 V. FIGS. 14A and 14B indicate that the properties are not much different, and regardless of whether the temperature is 400° C. or 600° C., there is not much difference in the generation the plasma discharge.

Figure 15A:
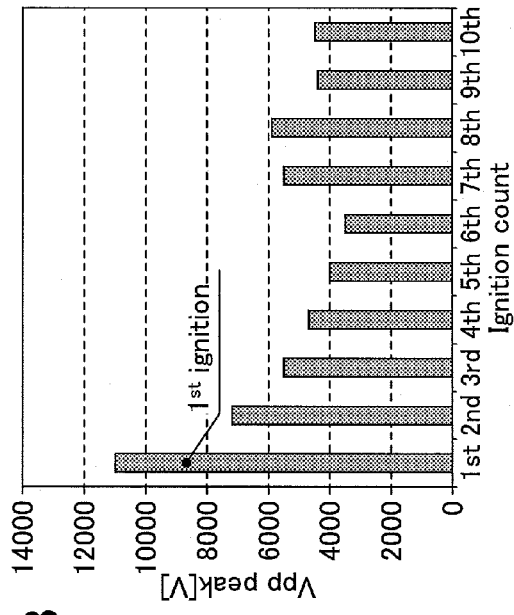
FIGS. 15A through 15D illustrate the voltage value of Vpp when plasma discharge is caused after 12 hours have passed since the previous plasma processing.
Figure 15B:
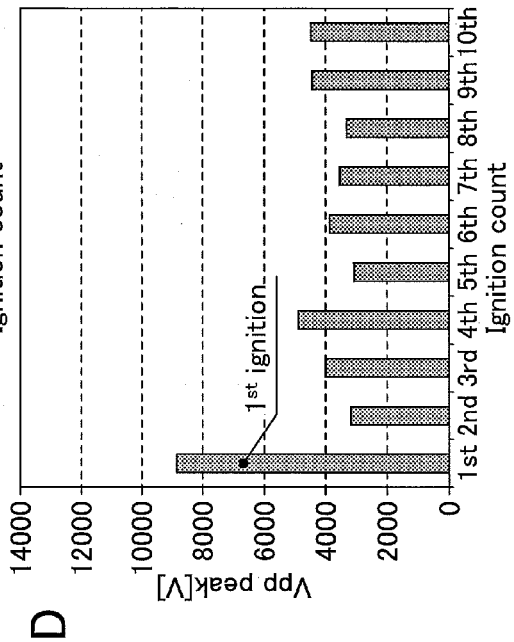
Figure 15C:
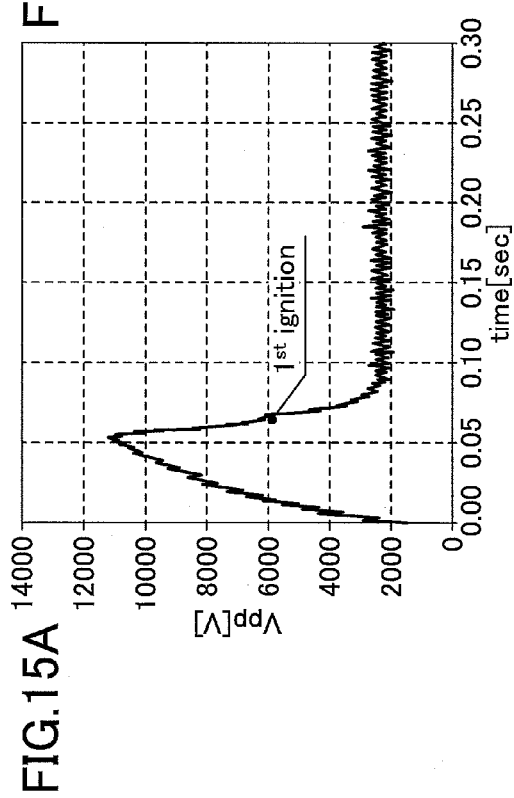
Figure 15D:
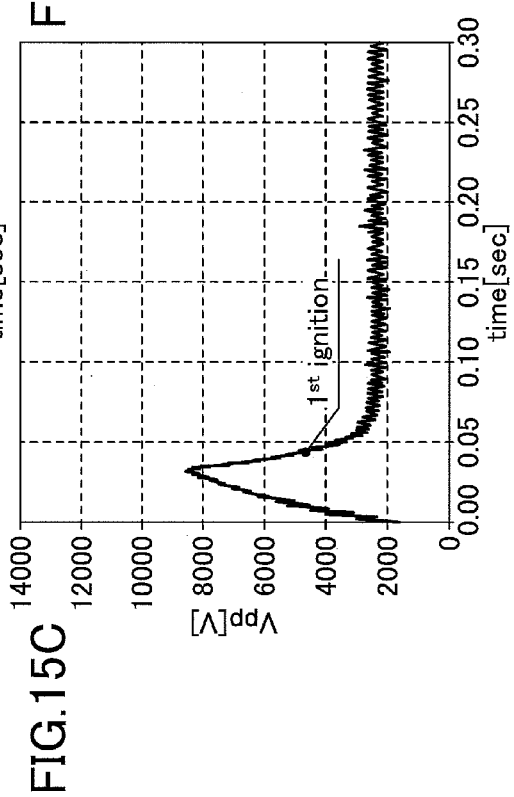

FIGS. 15A through 15D illustrate the voltage value of Vpp when plasma discharge is caused after 12 hours have passed since the previous plasma processing. FIG. 15A illustrates the temporal changes in the Vpp value of the first plasma discharge when the inside of the processing chamber 1 is 600° C., and FIG. 15B illustrates the temporal changes in the Vpp value of the tenth plasma discharge when the inside of the processing chamber 1 is 600° C. Furthermore, FIG. 15C illustrates the temporal changes in the Vpp value of the first plasma discharge when the inside of the processing chamber 1 is 400° C., and FIG. 15D illustrates the temporal changes in the Vpp value of the tenth plasma discharge when the inside of the processing chamber 1 is 400° C.

As illustrated in FIGS. 15A and 15B, when plasma discharge is caused in the processing chamber 1 having a temperature of 600° C. after a time interval of 12 hours, plasma discharge is finally caused when a high frequency voltage exceeding 10000 V is applied.

Furthermore, as illustrated in FIGS. 15C and 15D, when plasma discharge is caused in the processing chamber 1 having a temperature of 400° C. after a time interval of 12 hours, plasma discharge is caused when a high frequency voltage exceeding 8000 V is applied.

As illustrated in FIGS. 14A and 14B, when plasma discharge is caused without any time intervals, plasma discharge has been caused by applying a voltage of less than 6000 V. However, when plasma discharge is caused after a time interval of 12 hours, plasma discharge is not caused unless a high frequency voltage exceeding 8000 V is applied. Furthermore, in the processing chamber 1 having a high temperature of 600° C., plasma discharge is not caused unless a high frequency voltage exceeding 10000 V is applied. As described above, when a long time interval passes after the previous plasma discharge, an even higher high frequency voltage needs to be applied in order to cause plasma discharge, and the increase ratio of the high frequency voltage is higher in the processing chamber 1 of a higher temperature.

Figure 16A:
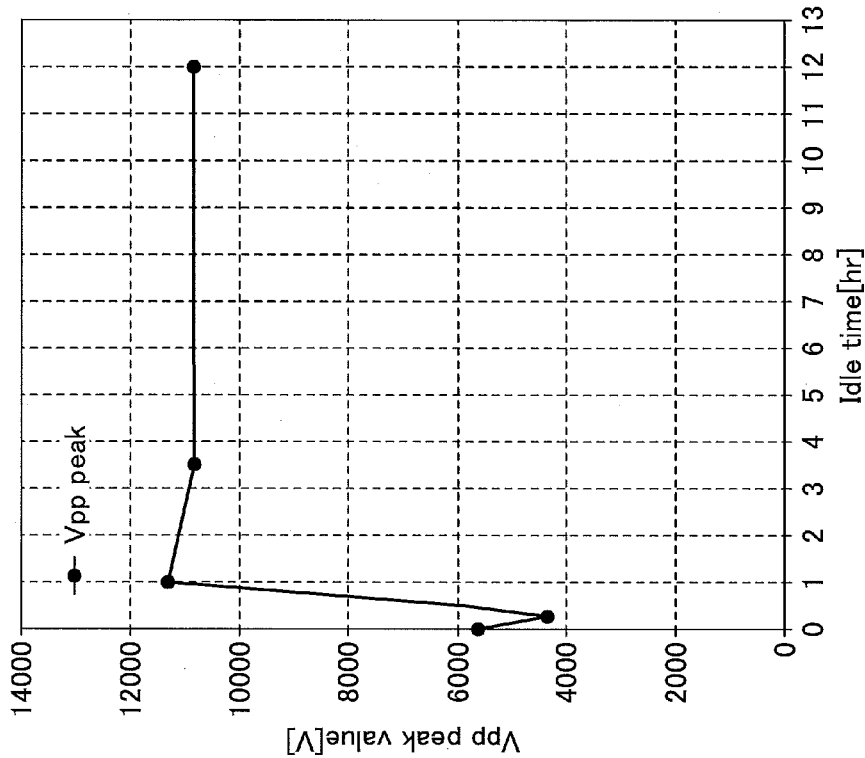
FIGS. 16A and 16B illustrate how the high frequency voltage, which is applied for causing plasma discharge, changes according to the length of the time interval.
Figure 16B:
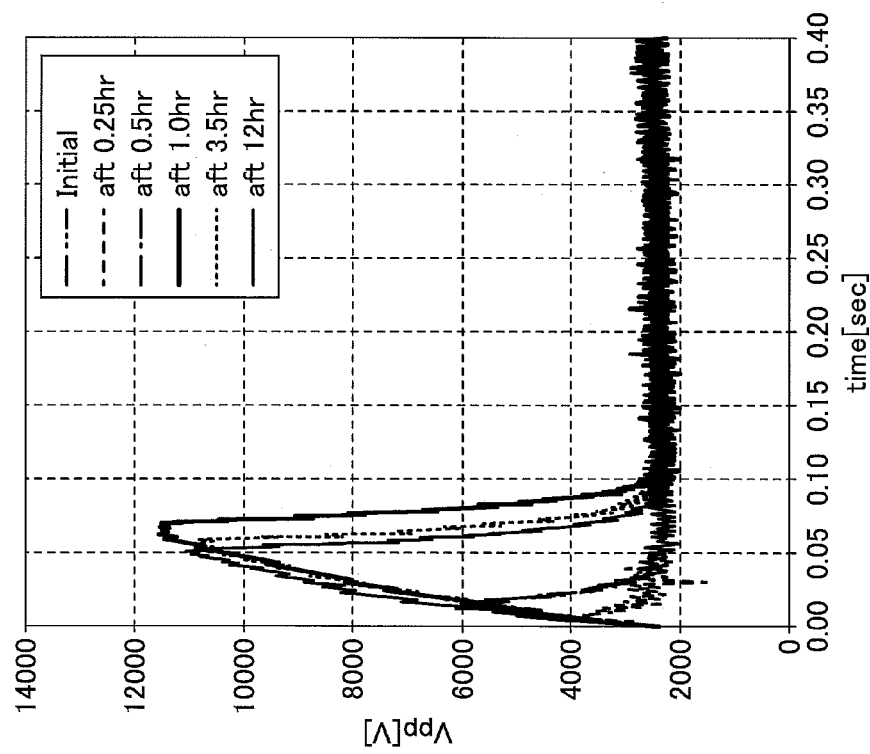

FIGS. 16A and 16B illustrate how the high frequency voltage, which is applied for causing plasma discharge, changes according to the length of the time interval. FIG. 16A illustrates the temporal change in the Vpp for causing plasma discharge, and FIG. 16B illustrates the relationship between the length of the time interval and the peak value of Vpp.

As illustrated in FIG. 16B, when the elapsed time exceeds 30 minutes, the peak value of Vpp exceeds 6000 V, and when the elapsed time exceeds one hour, the peak value of Vpp exceeds 10000 V. Thus, when the elapsed time exceeds 30 minutes, it is preferable to perform the charge storage process.

Note that also in FIG. 16A, results that match those of FIG. 16B are obtained, and when the elapsed time exceeds 30 minutes, the peak value of Vpp exceeds 6000 V, and particularly, when the elapsed time exceeds one hour, the peak value of Vpp exceeds 10000 V. According to these results, when resuming the process after 30 minutes have passed from the previous plasma processing process, it is preferable to perform the charge storage process according to an embodiment of the present invention, and when one hour has passed from the previous plasma processing process, it is preferable to definitely perform the charge storage process according to an embodiment of the present invention.

EXAMPLES

Next, a description is given of examples of implementing a plasma processing device and an operation method thereof according to an embodiment of the present invention.

Figure 17:
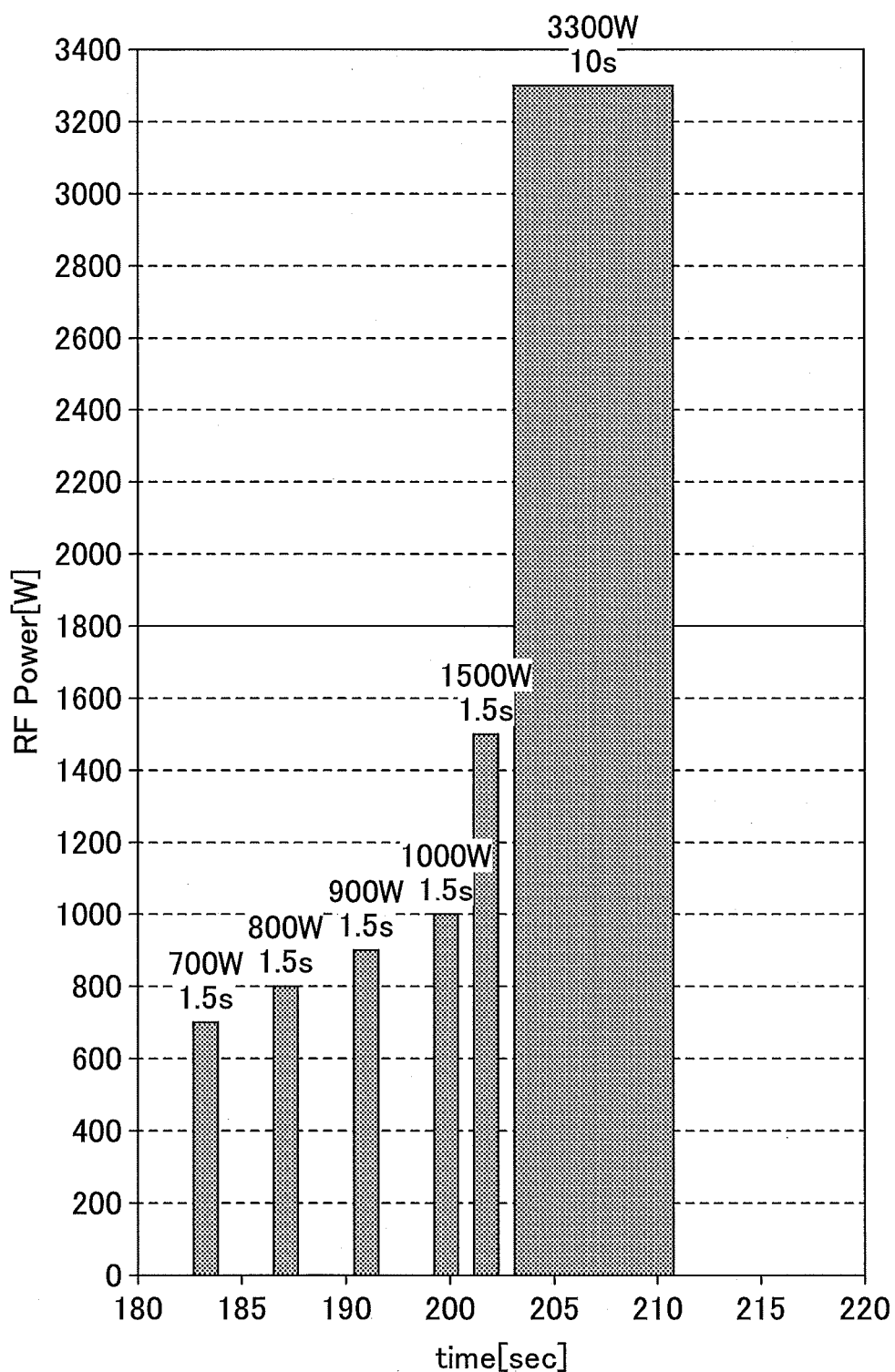
FIG. 17 illustrates a pattern of supplying high frequency power for charge storage when performing a charge storage process by the plasma processing device and the operation method thereof according to an embodiment of the present invention.

FIG. 17 illustrates a pattern of supplying high frequency power for charge storage when performing a charge storage process by the plasma processing device and the operation method thereof according to an embodiment of the present invention. In the present embodiment, when performing a plasma process, in a case of supplying high frequency power of 3300 W to the electrode 83 for ten seconds, in the charge storage process, the high frequency power for charge storage is supplied for the first time to the electrode 83 by an output of 700 W for 1.5 seconds, the high frequency power for charge storage is supplied for the second time to the electrode 83 by an output of 800 W for 1.5 seconds, the high frequency power for charge storage is supplied for the third time to the electrode 83 by an output of 900 W for 1.5 seconds, the high frequency power for charge storage is supplied for the fourth time to the electrode 83 by an output of 1000 W for 1.5 seconds, and subsequently, the maximum high frequency power for charge storage of 1500 W is supplied to the electrode 83 up to ten times, which is the maximum allowed number of times. Note that in FIG. 17, the maximum high frequency power for charge storage is only supplied once. However, when plasma discharge is not caused by supplying the high frequency power for charge storage of 1500 W once, this supply is repeated for a plural number of times by an output of 1500 W for 1.5 seconds each time.

Note that the interval of supplying high frequency power may be appropriately set within a range of several tenths of a second through several seconds, according to the performance of the matching box 84. Furthermore, conditions such as the pressure and temperature inside the processing chamber 1 are the same as those indicated in FIG. 13.

Figure 18:
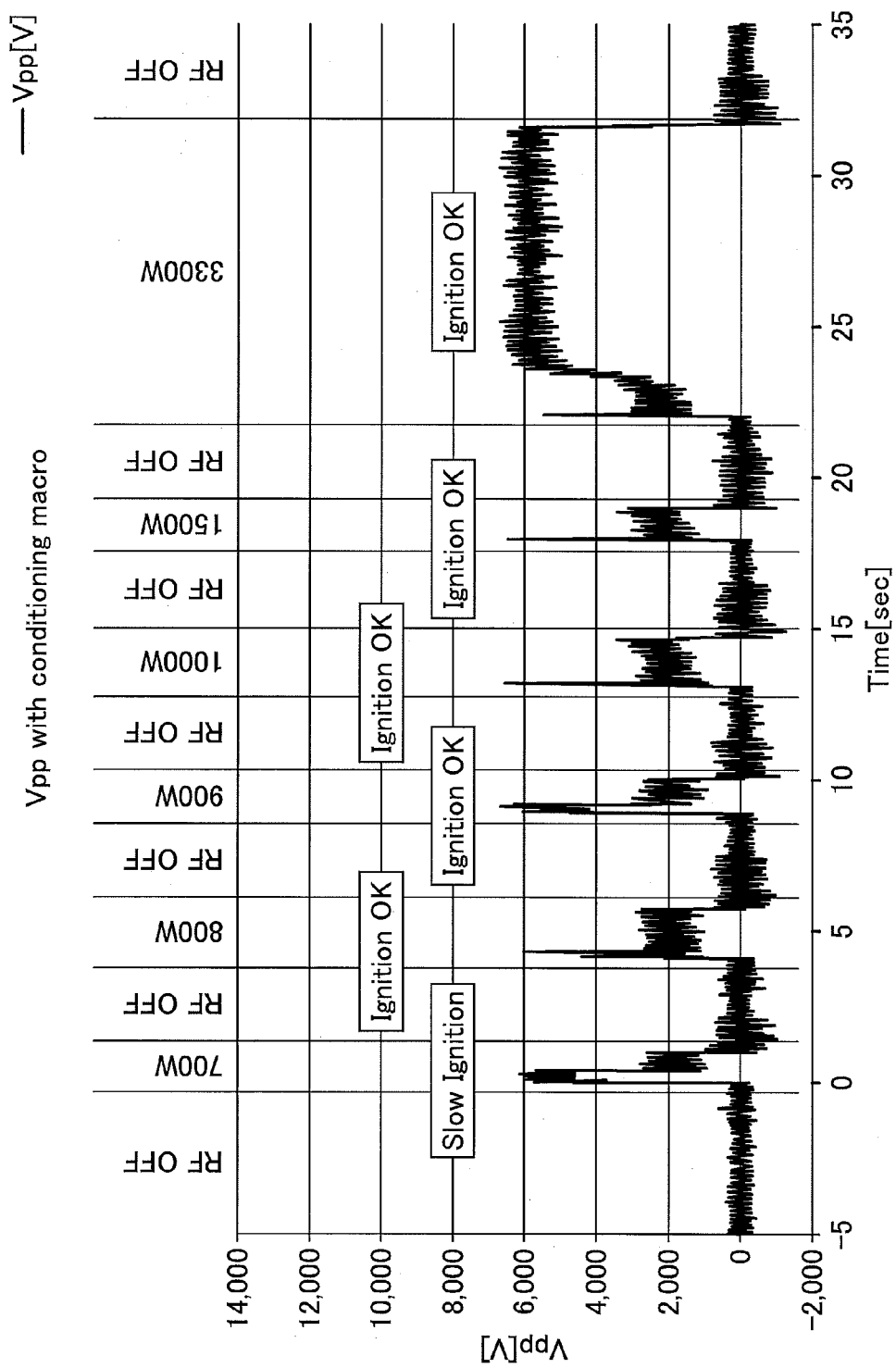
FIG. 18 illustrates the results of a first example, in which the elapsed time from the end of the previous plasma processing is one hour.

FIG. 18 illustrates the results of a first example, in which the elapsed time from the end of the previous plasma processing is one hour. In the first example, in the charge storage process, when high frequency power of an output of 700 W was supplied, only moderate plasma discharge was caused; however, when the next high frequency power of an output of 800 W was applied, plasma discharge was caused. In the subsequent outputs of 900 W, 1000 W, and 1500 W, plasma discharge was caused as a matter of course. In the actual plasma processing process, when high frequency power of 3300 W was supplied to the electrode 83, plasma discharge was normally caused.

Figure 19:
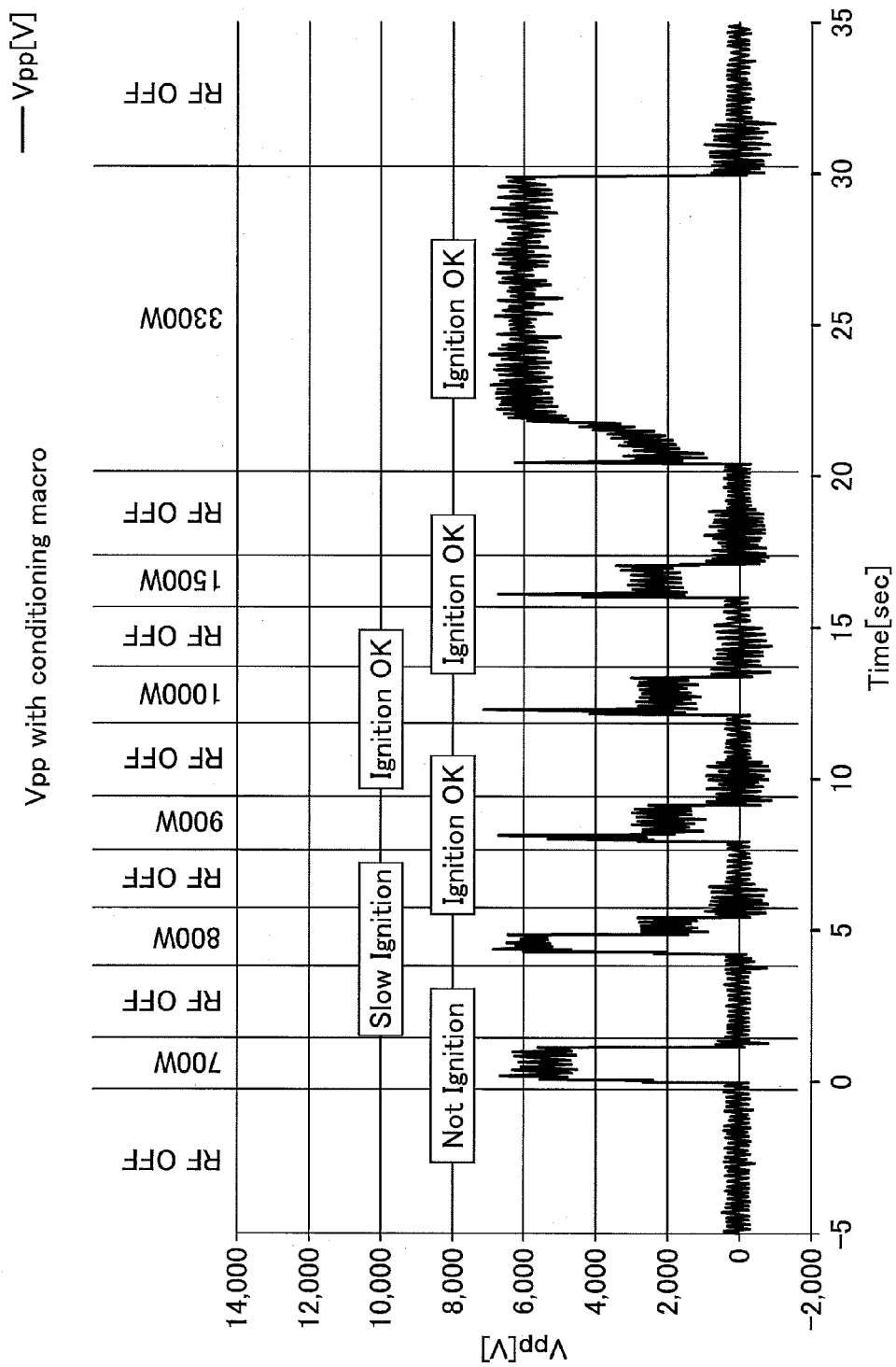
FIG. 19 illustrates the results of a second example, in which the elapsed time from the end of the previous plasma processing is three hours.

FIG. 19 illustrates the results of a second example, in which the elapsed time from the end of the previous plasma processing is three hours. In the second example, in the charge storage process, when high frequency power of an output of 700 W was supplied the first time and high frequency power of an output of 800 W was supplied the second time, only moderate plasma discharge was caused. However, when the next high frequency power of an output of 900 W was supplied, plasma discharge was caused. In the subsequent outputs of 1000 W and 1500 W, plasma discharge was caused as a matter of course. In the actual plasma processing process, when high frequency power of 3300 W was supplied to the electrode 83, plasma discharge was normally caused.

FIG. 20 illustrates the results of a third example, in which the elapsed time from the end of the previous plasma processing is 16 hours. In the third example, in the charge storage process, when high frequency power of outputs of 700 W through 900 W was supplied the first through third times, plasma discharge was not caused. When high frequency power of an output of 1000 W was supplied the fourth time, moderate plasma discharge was caused. When the next high frequency power of an output of 1500 W was supplied, plasma discharge was caused. Next, in the actual plasma processing process, when high frequency power of 3300 W was supplied to the electrode 83, plasma discharge was normally caused.

As described above, in any of the first through third examples, plasma discharge was caused in the charge storage process, and after shifting to the actual plasma processing process, plasma discharge was appropriately caused.

With respect to the plasma processing device and the operation method thereof according to an embodiment of the present invention, a description is mainly given of the plasma processing device constituted as a film deposition device and an operation method thereof; however, the present invention is suitably applicable to any other plasma processing device such as an etching device, as long as the device is for performing plasma processing.

According to the plasma processing device and the operation method thereof according to an embodiment of the present invention, even when the plasma processing device stops operating for a long time, plasma discharge can be stably caused.

The present invention is not limited to the specific embodiments described herein, and variations and modifications may be made without departing from the spirit and scope of the present invention.

What is claimed is:

1. An operation method of a plasma processing device, comprising:
    performing a plasma process on a workpiece by supplying first high frequency power of a predetermined output to an electrode and generating plasma; and
    performing a charge storage process before the plasma process when a time interval from an end of a previous operation of the plasma processing device exceeds a predetermined interval, the charge storage process including supplying, to the electrode, second high frequency power of a lower output than the predetermined output.

2. The operation method of the plasma processing device according to claim 1, wherein
    the second high frequency power is intermittently supplied to the electrode for a plurality of times.

3. The operation method of the plasma processing device according to claim 2, wherein
    the charge storage process is ended when the plasma is generated.

4. The operation method of the plasma processing device according to claim 3, wherein the charge storage process includes a sequence of supplying, to the electrode, the second high frequency power of a higher output than an output of the second high frequency power previously supplied to the electrode.

5. The operation method of the plasma processing device according to claim 4, wherein
the sequence is executed from a first one of the second high frequency power until an output of the second high frequency power reaches a predetermined maximum high frequency power for storage.

6. The operation method of the plasma processing device according to claim 5, wherein
after the output of the second high frequency power reaches the predetermined maximum high frequency power for storage, the predetermined maximum high frequency power for storage is supplied to the electrode for a number of times within a predetermined maximum number of times.

7. The operation method of the plasma processing device according to claim 6, wherein
an abnormality alarm is output when the plasma is not generated after supplying the predetermined maximum high frequency power for storage to the electrode for the predetermined maximum number of times.

8. The operation method of the plasma processing device according to claim 6, wherein
the predetermined maximum high frequency power is less than or equal to half the predetermined output of the first high frequency power.

9. The operation method of the plasma processing device according to claim 1, wherein
the predetermined interval is within a range of thirty minutes through two hours.

10. The operation method of the plasma processing device according to claim 1, wherein
the charge storage process is performed by setting a condition under which the plasma is more easily generated than in the plasma process.

11. The operation method of the plasma processing device according to claim 10, wherein
the condition under which the plasma is more easily generated, is that a pressure used in the charge storage process is lower than a pressure used in the plasma process.

12. The operation method of the plasma processing device according to claim 10, wherein
the condition under which the plasma is more easily generated, is that the plasma is more easily generated by plasma gas used in the charge storage process than by plasma gas used in the plasma process.

\* \* \* \* \*